(12) United States Patent
Goodman et al.

(10) Patent No.: US 8,967,935 B2
(45) Date of Patent: Mar. 3, 2015

(54) SUBSTRATE LOADER AND UNLOADER

(75) Inventors: Daniel Goodman, Lexington, MA (US);
Arthur Keigler, Wellesley, MA (US);
Freeman Fisher, Charlestown, MA (US)

(73) Assignee: Tel Nexx, Inc., Billerica, MA (US)

( * ) Notice: Subject to any disclaimer, the term of this patent is extended or adjusted under 35 U.S.C. 154(b) by 644 days.

(21) Appl. No.: 13/279,432

(22) Filed: Oct. 24, 2011

(65) Prior Publication Data

US 2013/0011222 A1   Jan. 10, 2013

Related U.S. Application Data

(60) Provisional application No. 61/527,222, filed on Aug. 25, 2011, provisional application No. 61/504,942, filed on Jul. 6, 2011, provisional application No. 61/504,920, filed on Jul. 6, 2011.

(51) Int. Cl.
H01L 21/687 (2006.01)
H01L 21/67 (2006.01)
H01L 21/683 (2006.01)

(52) U.S. Cl.
CPC ...... *H01L 21/67092* (2013.01); *H01L 21/6838* (2013.01); *H01L 21/68764* (2013.01); *H01L 21/68785* (2013.01)
USPC .................................................. 414/222.01

(58) Field of Classification Search
CPC ...... B25J 15/06; B25J 15/0616; B25J 15/065; B25J 15/0658; B25J 15/0675; B25J 15/0683; B25J 15/0691; H01L 21/6838; H01L 21/68721
USPC ............ 279/3; 294/183, 184, 185, 64.2, 64.3, 294/186, 187, 188, 189; 414/222.01, 414/222.04, 222.05, 225.01, 737, 752.1, 414/937, 938, 941
See application file for complete search history.

(56) References Cited

U.S. PATENT DOCUMENTS 3,623,962 A   11/1971   Beale
4,313,266 A   2/1982    Tam
4,439,261 A   3/1984    Pavone et al.

(Continued)

FOREIGN PATENT DOCUMENTS

EP   444756   9/1991
EP   444756   11/1995

(Continued)

*Primary Examiner* — Saul Rodriguez
*Assistant Examiner* — Brendan Tighe
(74) *Attorney, Agent, or Firm* — Rothwell, Figg, Ernst & Manbeck, P.C.

(57) ABSTRACT

A substrate loader adapted to load and unload a substrate to and from a moveable holder having a seal. The substrate loader has a base and a holder support frame coupled to the base, the holder support frame adapted to repeatably position the moveable holder relative to a predetermined datum. The substrate transport is coupled to the base and having a substrate chuck and adapted to move and transport the substrate relative to the holder. The substrate transport is deterministically positioned relative to the predetermined datum and is adapted to move the substrate from a first position, with the substrate captured by the moveable holder, to a second position with the substrate disengaged from the holder and the seal, the substrate transport movement of the substrate from the first to the second position effecting disengagement from the holder and the seal substantially without contacting the substrate.

22 Claims, 17 Drawing Sheets

(56) References Cited

U.S. PATENT DOCUMENTS

| | | | |
|---|---|---|---|
| 4,489,740 A | 12/1984 | Rattan et al. |
| 4,651,440 A | 3/1987 | Karl |
| 4,724,619 A | 2/1988 | Poli et al. |
| 4,855,775 A | 8/1989 | Matsuoka |
| 4,944,860 A | 7/1990 | Bramhall, Jr. et al. |
| 5,032,217 A | 7/1991 | Tanaka |
| 5,076,877 A | 12/1991 | Ueda et al. |
| 5,092,975 A | 3/1992 | Yamamura et al. |
| 5,156,174 A | 10/1992 | Thompson et al. |
| 5,168,886 A | 12/1992 | Thompson et al. |
| 5,168,887 A | 12/1992 | Thompson et al. |
| 5,203,360 A | 4/1993 | Nguyen et al. |
| 5,222,310 A | 6/1993 | Thompson et al. |
| 5,224,504 A | 7/1993 | Thompson et al. |
| 5,238,500 A | 8/1993 | Bergman |
| 5,271,774 A | 12/1993 | Leenaars et al. |
| 5,312,532 A | 5/1994 | Andricacos et al. |
| 5,316,642 A | 5/1994 | Young, Jr. et al. |
| 5,349,978 A | 9/1994 | Sago et al. |
| 5,357,991 A | 10/1994 | Bergman et al. |
| 5,365,031 A | 11/1994 | Mumola |
| 5,375,291 A | 12/1994 | Tateyama et al. |
| 5,421,056 A | 6/1995 | Tateyama et al. |
| 5,421,987 A | 6/1995 | Tzanavaras et al. |
| 5,431,421 A | 7/1995 | Thompson et al. |
| 5,445,172 A | 8/1995 | Thompson et al. |
| 5,513,668 A | 5/1996 | Sumnitsch |
| 5,516,412 A | 5/1996 | Andricacos et al. |
| 5,518,542 A | 5/1996 | Matsukawa et al. |
| 5,520,743 A | 5/1996 | Takahashi |
| 5,558,110 A | 9/1996 | Williford, Jr. |
| 5,562,113 A | 10/1996 | Thompson et al. |
| 5,566,466 A | 10/1996 | Hearne |
| 5,568,821 A | 10/1996 | Ohmori et al. |
| 5,573,023 A | 11/1996 | Thompson et al. |
| 5,591,262 A | 1/1997 | Sago et al. |
| 5,666,985 A | 9/1997 | Smith, Jr. et al. |
| 5,706,843 A | 1/1998 | Matsuo |
| 5,715,610 A | 2/1998 | Smith, Jr. et al. |
| 5,738,128 A | 4/1998 | Thompson et al. |
| 5,738,574 A | 4/1998 | Tolles et al. |
| 5,753,133 A | 5/1998 | Wong et al. |
| 5,775,000 A | 7/1998 | Maekawa et al. |
| 5,778,554 A | 7/1998 | Jones |
| 5,829,156 A | 11/1998 | Shibasaki et al. |
| 5,845,662 A | 12/1998 | Sumnitsch |
| 5,851,041 A | 12/1998 | Anderson et al. |
| 5,857,475 A | 1/1999 | Volk |
| 5,861,061 A | 1/1999 | Hayes et al. |
| 5,863,340 A | 1/1999 | Flanigan |
| 5,879,576 A | 3/1999 | Wada et al. |
| 5,882,433 A | 3/1999 | Ueno |
| 5,895,549 A | 4/1999 | Goto et al. |
| 5,954,072 A | 9/1999 | Matusita |
| 5,954,911 A | 9/1999 | Bergman et al. |
| 5,966,635 A | 10/1999 | Hiatt et al. |
| 5,966,765 A | 10/1999 | Hamada et al. |
| 5,972,127 A | 10/1999 | Thompson et al. |
| 5,974,681 A | 11/1999 | Gonzalez Martin et al. |
| 6,062,239 A | 5/2000 | Bexten |
| 6,074,544 A | 6/2000 | Reid et al. |
| 6,099,702 A | 8/2000 | Reid et al. |
| 6,125,863 A | 10/2000 | Bexten |
| 6,140,253 A | 10/2000 | Hayes et al. |
| 6,159,288 A | 12/2000 | Satou et al. |
| 6,167,893 B1 | 1/2001 | Taatjes et al. |
| 6,168,660 B1 | 1/2001 | Hayes et al. |
| 6,182,675 B1 | 2/2001 | Naka et al. |
| 6,203,582 B1 | 3/2001 | Berner et al. |
| 6,258,220 B1 | 7/2001 | Dordi et al. |
| 6,273,104 B1 | 8/2001 | Shinbara et al. |
| 6,292,972 B1 | 9/2001 | Ishihara et al. |
| 6,309,524 B1 | 10/2001 | Woodruff et al. |
| 6,334,902 B1 | 1/2002 | Mertens et al. |
| 6,357,457 B1 | 3/2002 | Taniyama et al. |
| 6,363,623 B1 | 4/2002 | Abraham |
| 6,391,110 B1 | 5/2002 | Satou et al. |
| 6,391,209 B1 | 5/2002 | Belongia et al. |
| 6,398,879 B1 | 6/2002 | Satou et al. |
| 6,412,503 B1 | 7/2002 | Lerner et al. |
| 6,417,117 B1 | 7/2002 | Davis |
| 6,432,214 B2 | 8/2002 | Bryer et al. |
| 6,454,918 B1 | 9/2002 | Sakaki |
| 6,491,764 B2 | 12/2002 | Mertens et al. |
| 6,511,540 B1 | 1/2003 | Davis |
| 6,516,815 B1 | 2/2003 | Stevens et al. |
| 6,517,689 B1 | 2/2003 | Hongo et al. |
| 6,536,454 B2 | 3/2003 | Lindner |
| 6,537,416 B1 | 3/2003 | Mayer et al. |
| 6,577,382 B2 | 6/2003 | Kida et al. |
| 6,578,853 B1 | 6/2003 | Treur et al. |
| 6,599,402 B2 * | 7/2003 | Dordi et al. ............ 204/212 |
| 6,599,571 B2 | 7/2003 | Davis |
| 6,612,014 B1 | 9/2003 | Donoso et al. |
| 6,645,344 B2 | 11/2003 | Caldwell et al. |
| 6,708,701 B2 | 3/2004 | Emami |
| 6,725,565 B2 * | 4/2004 | Harano et al. ............ 34/266 |
| 6,752,442 B2 | 6/2004 | McNurlin et al. |
| 6,770,149 B2 | 8/2004 | Satou et al. |
| 6,770,565 B2 | 8/2004 | Olgado et al. |
| 6,786,996 B2 | 9/2004 | Emami |
| 6,807,972 B2 | 10/2004 | Chiu et al. |
| 6,811,618 B2 | 11/2004 | Kuroda |
| 6,822,413 B2 * | 11/2004 | Simondet ............ 318/568.21 |
| 6,824,343 B2 | 11/2004 | Kurita et al. |
| 6,824,612 B2 | 11/2004 | Stevens et al. |
| 6,827,092 B1 | 12/2004 | Smith et al. |
| 6,913,651 B2 | 7/2005 | Ivanov et al. |
| 6,921,466 B2 | 7/2005 | Hongo et al. |
| 6,964,724 B2 | 11/2005 | Yamasaki et al. |
| 6,967,174 B1 | 11/2005 | Mayer et al. |
| 7,000,622 B2 | 2/2006 | Woods et al. |
| 7,000,623 B2 | 2/2006 | Welsh et al. |
| 7,087,122 B2 | 8/2006 | Smith et al. |
| 7,094,291 B2 | 8/2006 | Reardon et al. |
| 7,128,823 B2 | 10/2006 | Yang et al. |
| 7,138,016 B2 | 11/2006 | Reardon et al. |
| 7,201,808 B2 | 4/2007 | Chiu et al. |
| 7,223,323 B2 | 5/2007 | Yang et al. |
| 7,226,055 B1 | 6/2007 | Bettencourt et al. |
| 7,241,372 B2 | 7/2007 | Sendai et al. |
| 7,247,222 B2 | 7/2007 | Yang et al. |
| 7,256,132 B2 | 8/2007 | Lerner et al. |
| 7,306,002 B2 | 12/2007 | Kim et al. |
| 7,399,713 B2 | 7/2008 | Aegerter et al. |
| 7,402,227 B2 | 7/2008 | Yoshioka et al. |
| 7,404,407 B2 | 7/2008 | Orii et al. |
| 7,429,537 B2 | 9/2008 | Aegerter et al. |
| 7,518,288 B2 | 4/2009 | Bran |
| 7,520,939 B2 | 4/2009 | Ho et al. |
| 7,651,306 B2 | 1/2010 | Rice et al. |
| 7,670,465 B2 | 3/2010 | Yang et al. |
| 7,694,647 B2 | 4/2010 | Ishikawa et al. |
| 7,735,710 B2 | 6/2010 | Kurita et al. |
| 7,743,728 B2 | 6/2010 | Ishikawa et al. |
| 7,780,867 B1 | 8/2010 | Mayer et al. |
| 7,798,764 B2 | 9/2010 | Rice et al. |
| 7,807,027 B2 | 10/2010 | Yoshioka et al. |
| 7,811,422 B2 | 10/2010 | Zimmerman |
| 7,819,079 B2 | 10/2010 | Englhardt et al. |
| 7,833,393 B2 | 11/2010 | Yoshioka et al. |
| 7,862,658 B2 | 1/2011 | Yamasaki et al. |
| 7,866,058 B2 | 1/2011 | Kim et al. |
| 7,922,440 B2 | 4/2011 | Du Bois et al. |
| 7,925,377 B2 | 4/2011 | Ishikawa et al. |
| 7,938,131 B2 | 5/2011 | Hahn et al. |
| 7,988,817 B2 | 8/2011 | Son |
| 2002/0066475 A1 | 6/2002 | Verhaverbeke et al. |
| 2003/0000034 A1 | 1/2003 | Welsh et al. |

(56) References Cited

U.S. PATENT DOCUMENTS

| | | |
|---|---|---|
| 2004/0194817 A1 | 10/2004 | Pope et al. |
| 2010/0043839 A1 | 2/2010 | Hamada et al. |

FOREIGN PATENT DOCUMENTS

| | | |
|---|---|---|
| EP | 898301 | 2/1999 |
| EP | 905747 | 3/1999 |
| EP | 8983013 | 11/2000 |
| EP | 905747 | 11/2005 |
| EP | 898301 | 9/2006 |
| JP | 57207571 | 12/1982 |
| JP | 1116094 | 5/1989 |
| JP | 2138737 | 5/1990 |
| JP | 5206348 | 8/1993 |
| JP | 8134699 | 5/1996 |
| JP | 11152597 | 6/1999 |

* cited by examiner

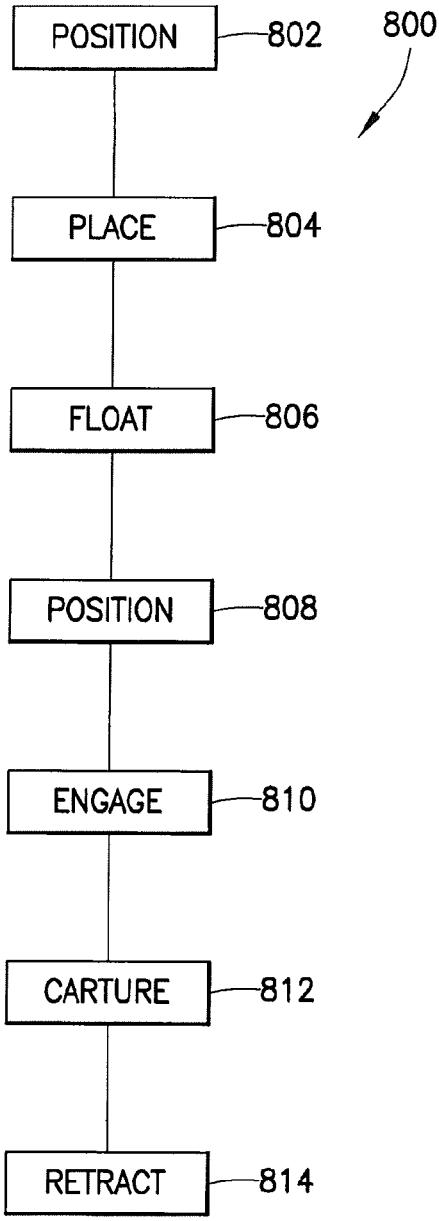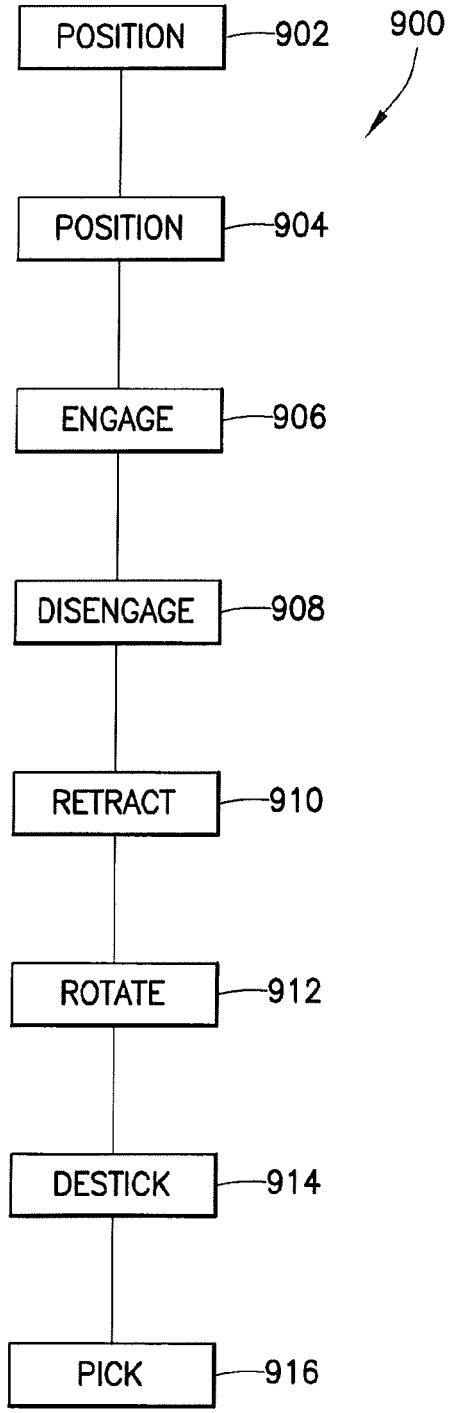
FIG.19
FIG.20

SUBSTRATE LOADER AND UNLOADER

RELATED APPLICATIONS

This application claims the benefit of and priority from U.S. Provisional Patent Application Ser. No. 61/527,222, entitled "SUBSTRATE LOADER AND UNLOADER", filed on Aug. 25, 2011, U.S. Provisional Patent Application Ser. No. 61/504,942, entitled "SUBSTRATE LOADER AND UNLOADER HAVING A BERNOULLI SUPPORT", filed on Jul. 6, 2011 and U.S. Provisional Patent Application Ser. No. 61/504,920, entitled "SUBSTRATE LOADER AND UNLOADER HAVING AN AIR BEARING SUPPORT", filed on Jul. 6, 2011, all of which are hereby incorporated by reference herein in their entireties. This application is related U.S. patent applications, entitled "SUBSTRATE LOADER AND UNLOADER HAVING A BERNOULLI SUPPORT", U.S. patent application Ser. No. 13/279,405, filed on Oct. 24, 2011, now U.S. Pat. No. 8,613,474, issued on Dec. 24, 2013, and entitled "SUBSTRATE LOADER AND UNLOADER HAVING AN AIR BEARING SUPPORT", U.S. patent application Ser. No. 13/279,414, filed on Oct. 24, 2011.

BACKGROUND

1. Field

The disclosed embodiments relate generally to a substrate loader and unloader and more specifically to a substrate loader and unloader having a non contact substrate support.

2. Brief Description of Related Developments

Fluid processing, among other processes, is used as a manufacturing technique for the application or removal of films and materials to various structures and surfaces, such as semiconductor wafers and silicon work pieces or substrates of varying materials. During fluid processing it may be desired to seal or place a substrate against, for example an elastomeric surface, and subsequently remove the substrate from the elastomeric surface after one or more processing steps have been completed. Further, substrate processing may be done in a clean environment and comparatively clean processing and transport. A problem arises when processing and transporting substrates in a clean environment where particulates and other contamination or damage may occur to the substrate by virtue of the process and/or transport method. Accordingly, there is a desire to provide fluid processing and transport of substrates while minimizing contamination and damage to the substrate.

BRIEF DESCRIPTION OF THE DRAWINGS

The foregoing aspects and other features of the embodiments are explained in the following description, taken in connection with the accompanying drawings.

FIGS. 19-20 are respectively flow diagrams graphically illustrating processes for loading and unloading a substrate from the holder.

DETAILED DESCRIPTION OF THE EMBODIMENTS

Figure 1:
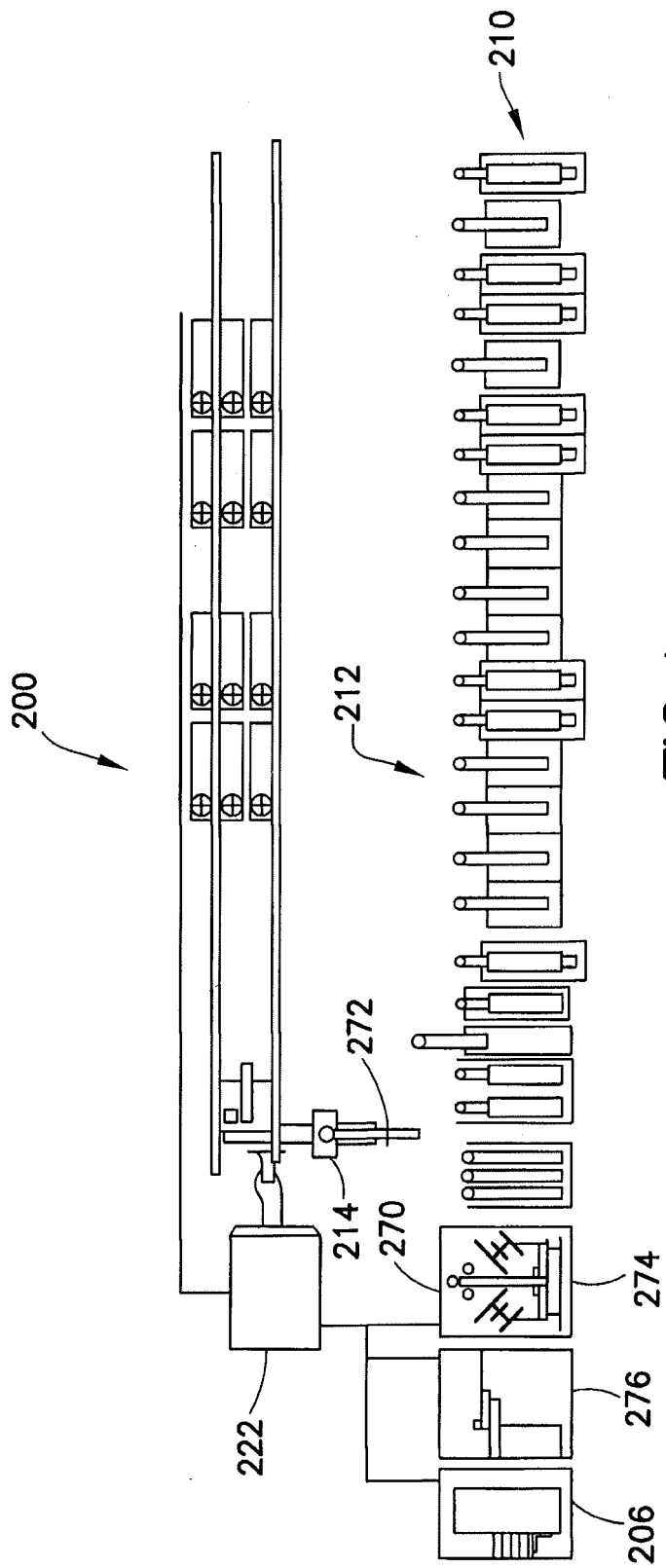
FIG. 1 shows an exemplary wafer processing system.

Although the present embodiments will be described with reference to the embodiments shown in the drawings, it should be understood that the embodiments can be embodied in many alternate forms of embodiments. In addition, any suitable size, shape or type of elements or materials could be used.

Figure 2:
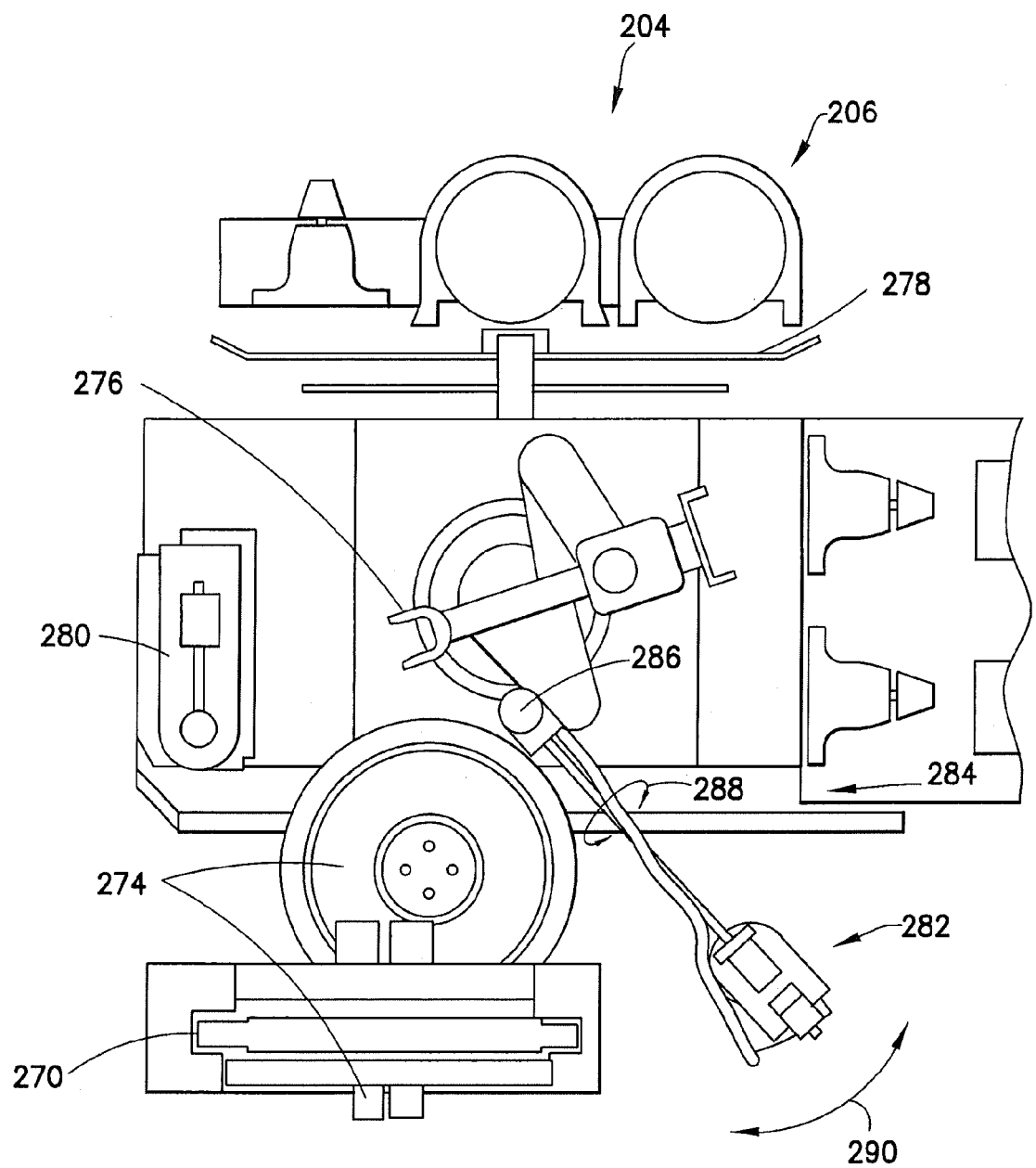
FIG. 2 shows a front end loading and unloading portion of an exemplary wafer processing system.

Referring now to FIG. 1, there is shown an exemplary wafer processing machine 200 suitable for a manufacturing process using the present disclosed embodiments. Referring also to FIG. 2, there is shown a front end loading and unloading portion 204 of an exemplary wafer processing system 200. The disclosed embodiments may be implemented in an electroplating, cleaning or etching system and may be used in combination with an electro deposition machine such as the Stratus from NEXX Systems in Billerica Mass. System 200 and modules 210 may incorporate features as disclosed in the International Application WO 2005/042804 A2 published under the Patent Cooperation Treaty and having publication date May 12, 2005 and as disclosed in U.S. Publication No. 2005/0167275 published Aug. 14, 2005 and entitled Method and Apparatus for Fluid Processing a Work Piece, both of which are hereby incorporated by reference herein in their entirety. System 200 is shown as an exemplary system. In alternate embodiments, more or fewer modules may be provided having different configurations and locations. System 200 may contain load ports 206 by which substrates previously processed, such as being patterned with photoresist or otherwise processed are inserted and withdrawn from the system. Loading station 204 may have a robotic arm 276 which may selectively transfer substrates 278 to pre aligner 280, pick up and flip device 282 or buffer module 284. Pick up and flip device (PUF) 282 may have one or more vacuum chuck(s) 286 to grip the backside of substrate 278 and also has first 288 and second 290 rotation axis in addition to a vertical z axis to respectively invert and transport substrate 278 to and from wafer loader module 274 where wafer loader module 274 may load wafer(s) to holders 270, 272. Here, loader module 274 may have features as further described below and for gripping and un gripping one or more wafers either in parallel or selectively of holder 270. In alternate embodiments, robotic arm 276 may transport a single wafer, a batch of wafers or a combination thereof. In alternate embodiments, more than one loader module 274 may be provided to load holders 270, 272 in parallel or to load wafers onto different types of holders where holders 270, 272 may have different features or be used for different types of processes. In other alternate embodiments, the system may not include a PUF, the robotic arm loading and unloading substrates directly from the wafer loader module. An example of holder 270 is disclosed in U.S. Pat. No. 7,445,697, issued Nov. 4, 2008 and entitled Method and Apparatus for Fluid Processing a Work Piece which is hereby incorporated by reference in its entirety. In alternate embodiments, any suitable combination of holder(s) may be utilized within system 200. Process modules 210 may have features, for example, where modules 210 may be suitable for electroplating wafers, anodizing wafers, cleaning wafers, such as liquid stripping of photoresist, seed layer etching, general wafer cleaning or otherwise. By way of further example, in operation, cassettes (or FOUPs) of wafers are loaded into system 200 at front end 204, individual wafers are loaded onto wafer holders 270 that hold wafers during processing where wafers, mounted in wafer holders, are transported within the wet process area 212 by wafer transporter 214. In wet-process area 212 wafers may be transferred through pre-treatment, rinse, and a sequence of alternating plating and rinsing steps or otherwise as defined by recipes. Controller(s) 220 may be provided within each station or module to sequence the process and/or transport within the station or module. A system controller(s) 222 may be provided within the system 200 to sequence interactions between the stations or process modules and to coordinate system actions, such as, host communication, lot loading and unloading or otherwise those actions that are required to control the system 200. In alternate embodiments, process modules 210 may include a combination of cleaning and electro deposition modules. In alternate embodiments, more or less modules in more or less suitable combinations may be provided in any suitable combination. As such, all such variations, alternatives and modifications of system 200 configurations are embraced.

Figure 3:
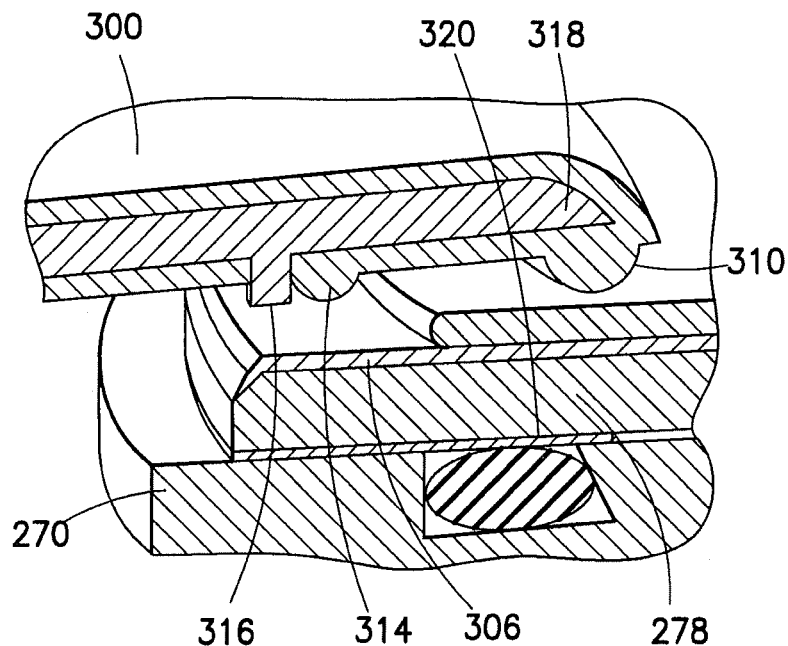
FIG. 3 shows a contact ring seal.
Figure 4:
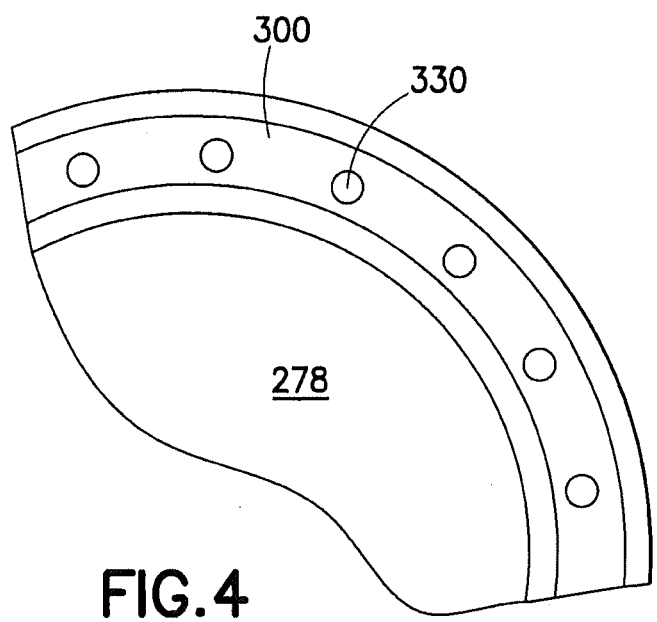
FIG. 4 shows a contact ring seal.
Figure 5:
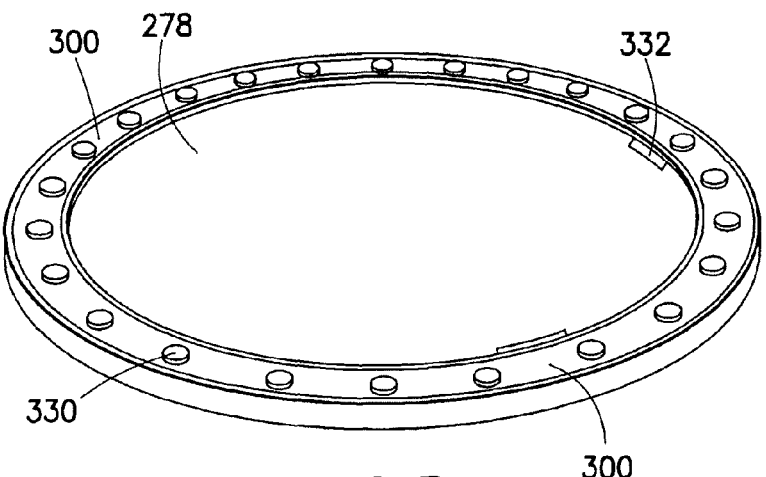
FIG. 5 shows a contact ring seal.
Figure 6A:
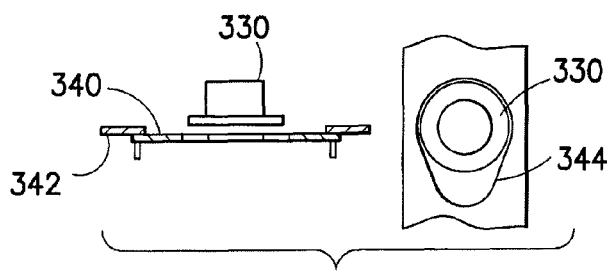
FIG. 6A shows a contact ring seal lock pin and spring plate.
Figure 6B:
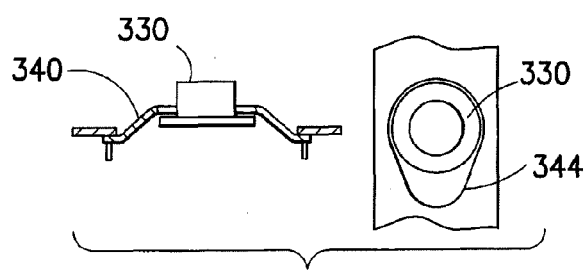
FIG. 6B shows a contact ring seal lock pin and spring plate.
Figure 6C:
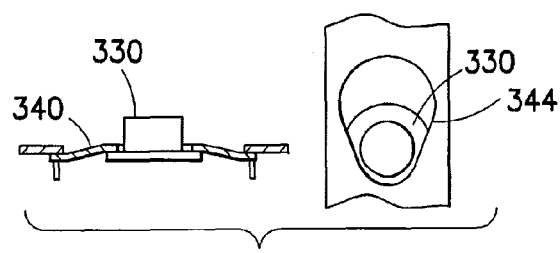
FIG. 6C shows a contact ring seal lock pin and spring plate.

Referring now to FIG. 3, there is shown an exemplary sealing portion referred to herein for description purposes as a contact ring seal 300. Referring also to FIG. 4, there is also shown contact ring seal 300. Referring also to FIG. 5, there is also shown contact ring seal 300. As may be realized, the contact ring seal is configured to be coupled to the holder frame and capture the substrate to the holder. A suitable example of a contact ring seal is described and shown in U.S. Pat. No. 6,540,899, issued Apr. 1, 2003. Another suitable example of a control ring seal is described and shown in U.S. Pat. No. 7,722,747 incorporated by reference herein. In alternate embodiments any suitable contact ring seal may be used. In the embodiment shown, substrate 278 may have seed layer 306 and resist layer 308. With respect to FIG. 3, contact ring seal 300 is assembled to and coupled to holder 270 where contact ring seal 300 seals with primary seal 310 to photoresist layer 308 and secondary seal 314 to seed layer 306 where the seal material may be Viton® or any suitable material. Spaced electrical contacts 316 distribute electrical contact evenly around the circumference of wafer 278 and may provide a mechanism 318 to axially stiffen contact ring seal 300 for effective sealing of seal 310 where contacts 316 may be substantially embedded within the Viton® or otherwise. O-ring 318 may be provided within holder 270 to provide an additional seal on the wafer backside around the circumference of wafer 278 within edge exclusion zone 320. Lock pins 330 may be provided around the circumference of contact ring seal 300 where lock pins 330 engage key holes in holder 270 as will be described in greater detail below. One or more alignment bosses 332 may be provided on contact ring seal 300 to provide alignment, for example as shown with respect to FIG. 5, where, for example, substrate 278 may be supported by chuck 370 (see also FIG. 7) as will be described and tilted or otherwise to drive substrate 278 against alignment bosses 332. In operation, one or more wafers 278 may be mounted to wafer holder 270 by a temporary, leak-proof seal 310 around the full circumference of wafer 278 where the sealing force may be created by a flexure, for example, an annular spring or otherwise. In the exemplary embodiment where springs 340, as seen in FIG. 6A-6C, may be embedded within each wafer holder 270 where spring force may be maintained locally inside each wafer holder independent of the rest of the process tool. Here, wafers 278 may remain sealed to wafer holders 270 during all phases of processing. In the embodiment shown, sealing may be 100% tested prior to processing. Here machined features may be provided on wafer holder 270 to positively align wafers as they are presented to each process module where no additional physical adjustment may be required once inserted into a module. In the embodiment shown, wafer holder 270 may provide a source of gripping wafers for transport that avoids contact with the wafer surface where wafer holder 270 in cooperation with contact ring seal 300 may act as the active cathode during electrochemical deposition (ECD) or otherwise.

Referring now to FIG. 6A, there is shown a contact ring seal lock pin and spring plate. Referring also to FIG. 6B, there is shown a contact ring seal lock pin and spring plate in another position. Referring also to FIG. 6C, there is shown a contact ring seal lock pin and spring plate. In still another position, the arrangement in the illustrated embodiment is merely one exemplary configuration of coupling the seal 300 to the holder, and in alternate embodiments any suitable configuration may be used. In the embodiment shown, spring plate 342 is provided within holder 270 where spring plate has flexures 340 and keyholes 344 that engage lock pins 330 in contact ring seal 300. In FIG. 6A, lock pin 330 is aligned with a portion of keyhole 344 that has clearance to allow keyhole 344 to axially move past the shoulder of lock pin 330 when air pressure or otherwise within holder 270 expands flexures 340 of spring plate 340 as seen in FIG. 6B. As seen in FIG. 6C, contact ring seal 300 may be rotated by loader 274 as will be described below to engage a portion of keyhole 344 that interferes with the shoulder of lock pin 330 where flexures 340 axially preload the seals associated with contact ring seal 300 when air pressure is relieved allowing spring plate 342 to retract engaging the key holes 344 with the shoulders of lock pins 330 thus retaining substrate 278 within holder 270 during transport and processing.

Figure 7:
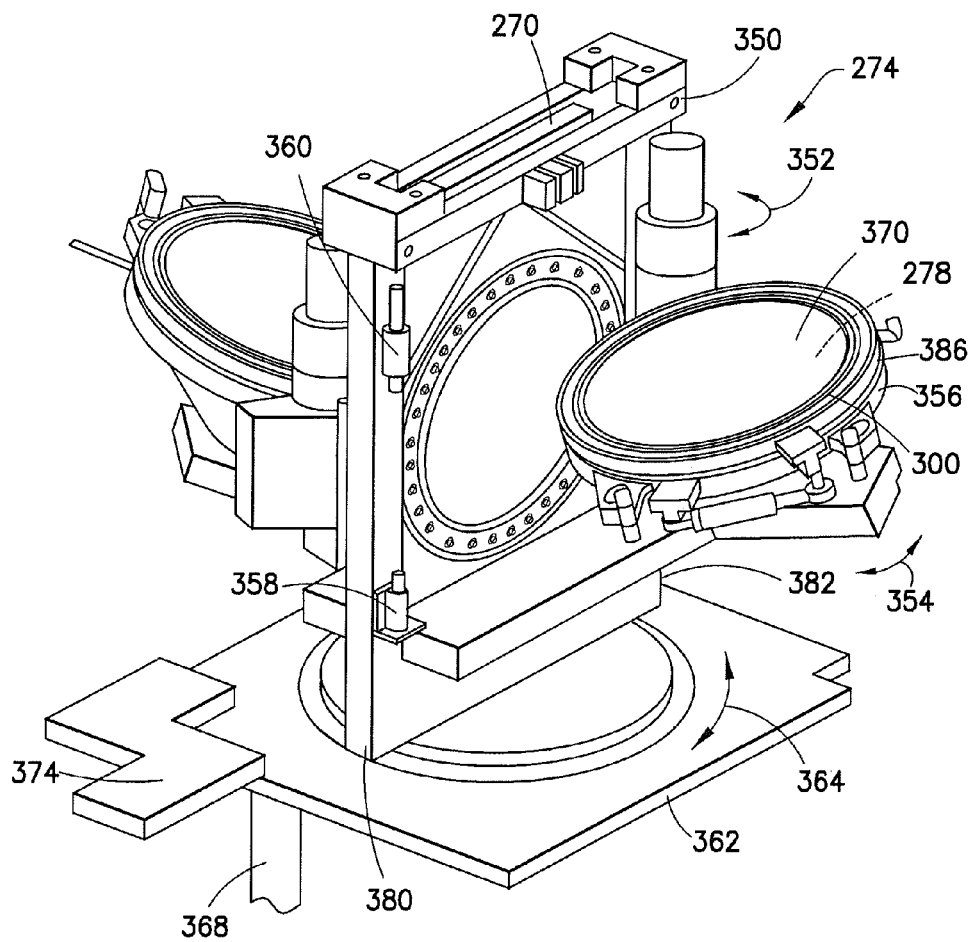
FIG. 7 shows an auto loader and unloader.
Figure 8:
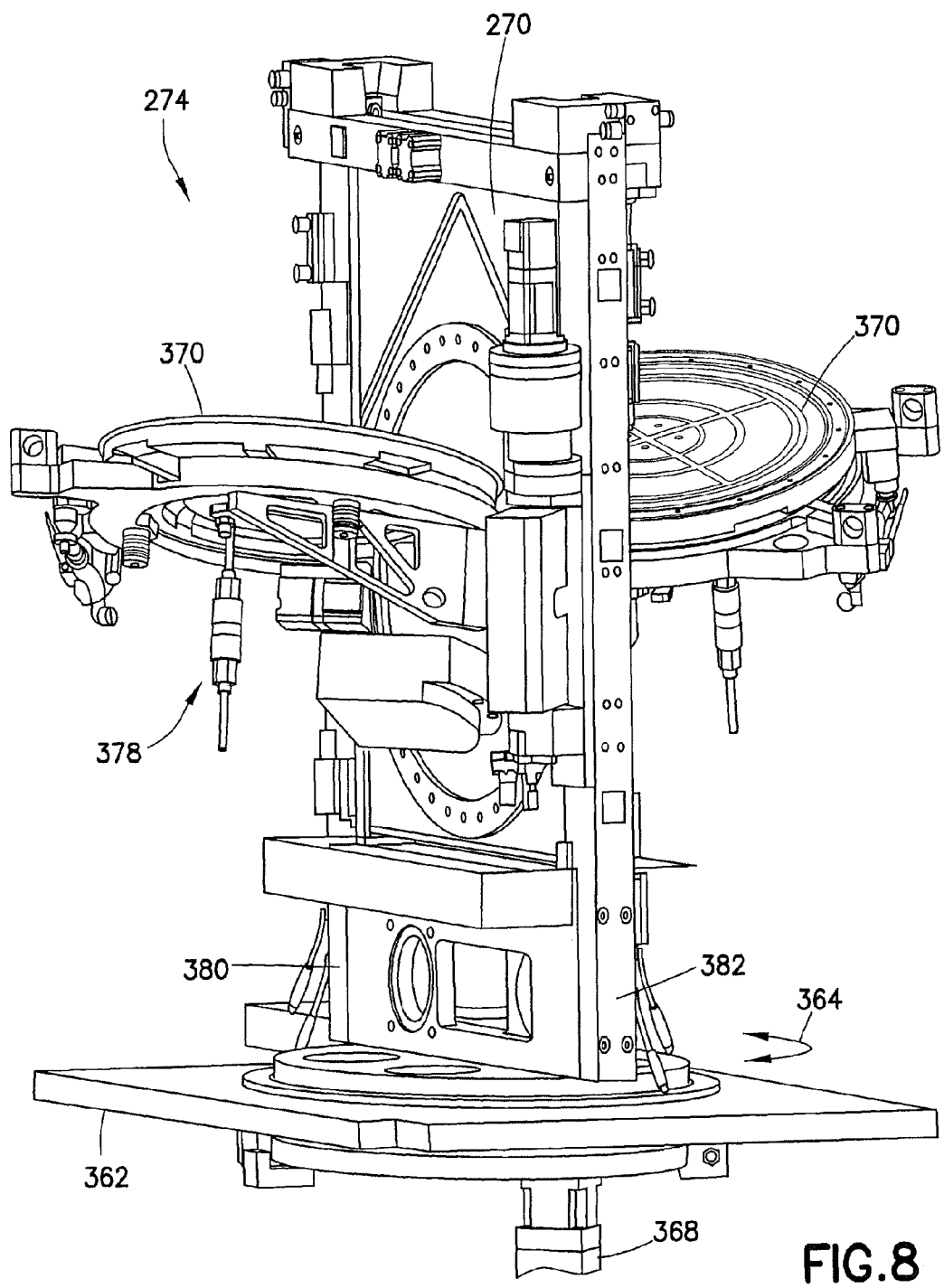
FIG. 8 shows an auto loader and unloader.
Figure 9:
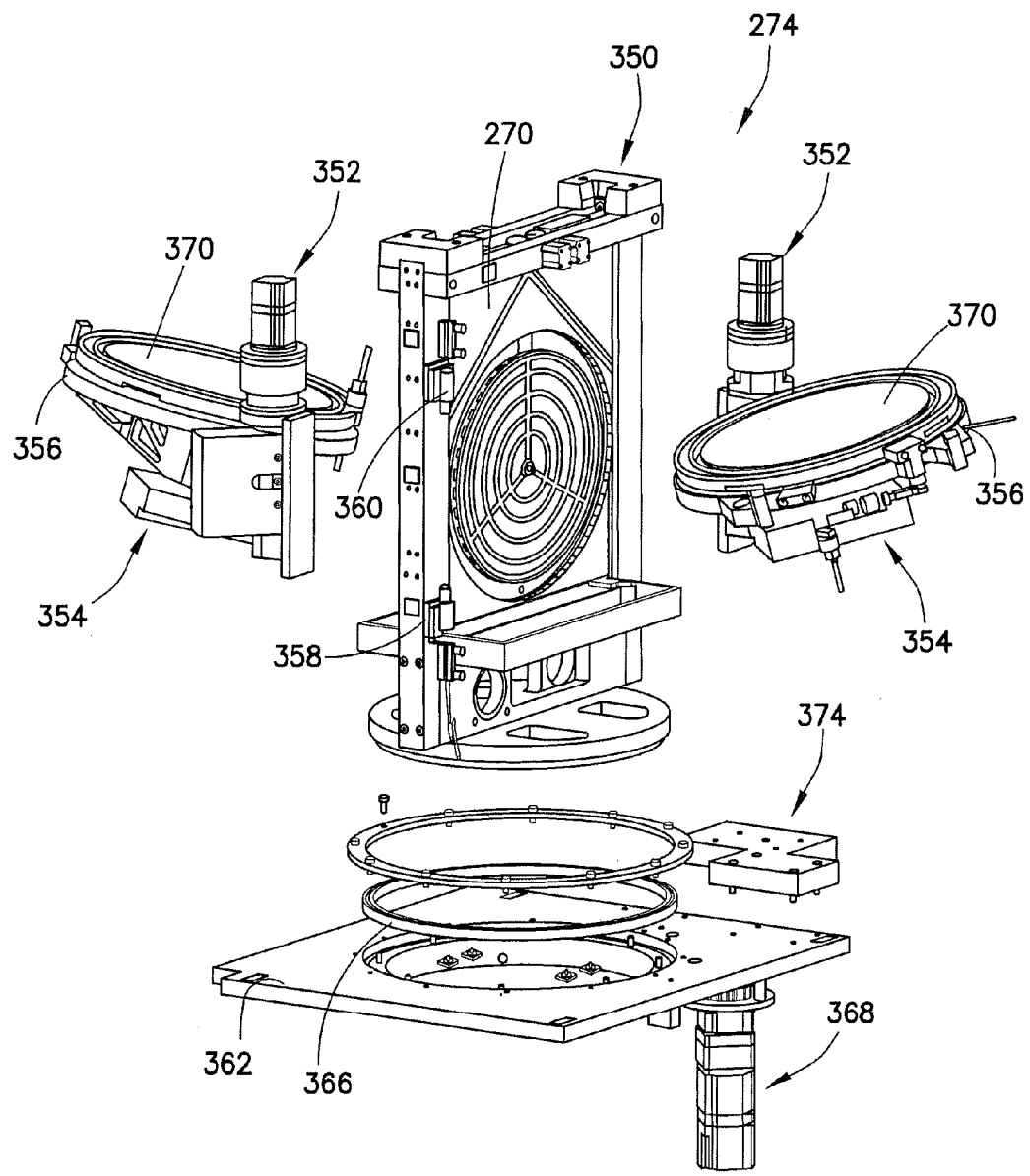
FIG. 9 shows an exploded view of an auto loader and unloader.
Figure 10:
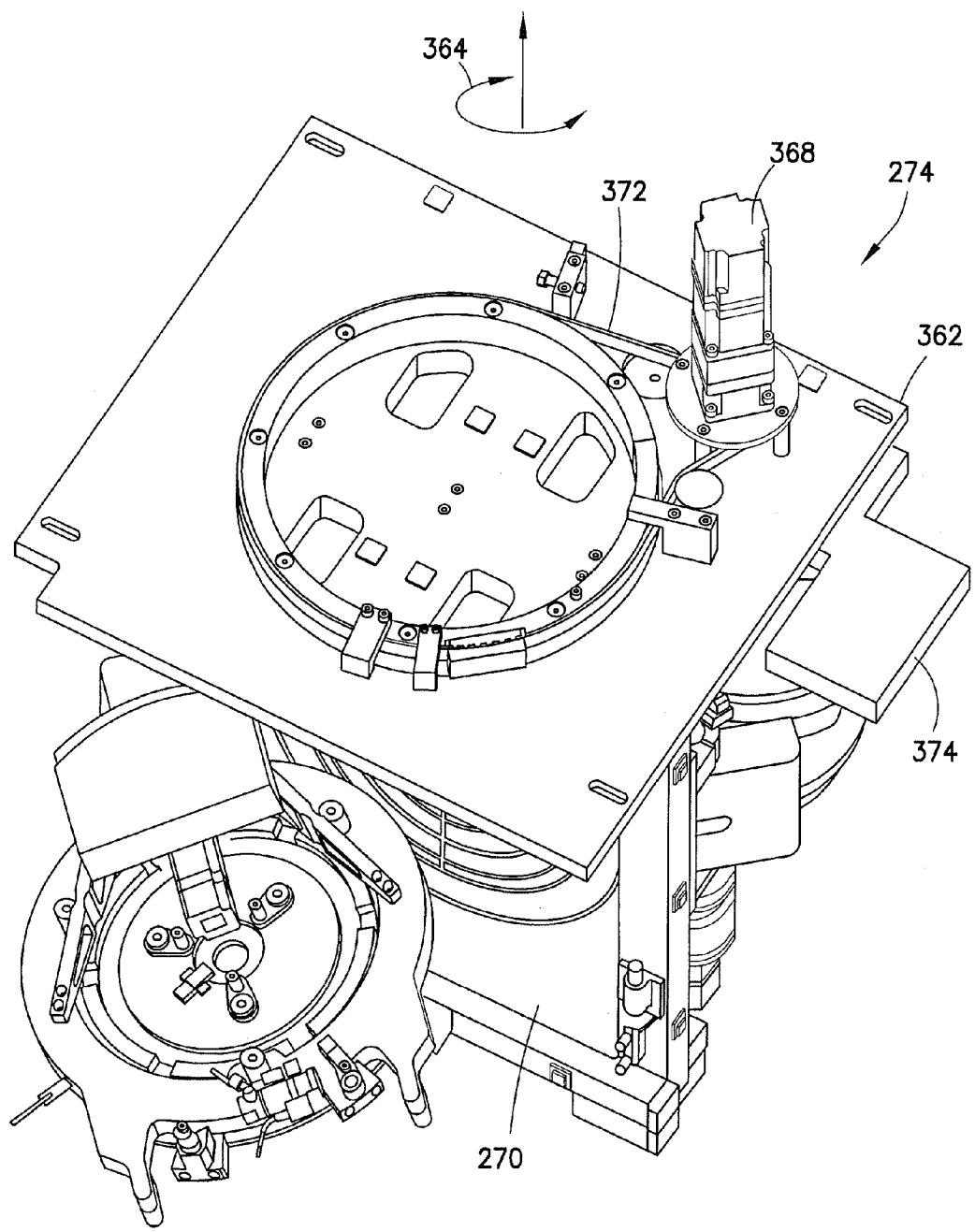
FIG. 10 shows a lower view of an auto loader and unloader.

Referring now to FIG. 7, there is shown an exemplary auto loader and unloader 274 and exemplary holder 270. Autoloader 274 may mount individual wafers onto wafer holders before they are processed and may dismount wafers after processing is complete. In the embodiment shown, holder 270 may hold two substrates on opposing sides of holder 270 where loader 274 may have two opposing loading and unloading features as shown. Referring also to FIG. 8, there is shown an exemplary auto loader and unloader 274 and exemplary holder 270. Referring also to FIG. 9, there is shown an exploded view of exemplary auto loader and unloader 274 and exemplary holder 270. Referring also to FIG. 10, there is shown a lower view of exemplary auto loader and unloader 274 and exemplary holder 270. In the embodiment shown, coupled to frame 350 to form an integral assembly unit may be swing axis 352, tilt axis 354 perpendicular to swing axis 352, door assembly 356 and door clamps 358, 360. Frame 350 may have integral guidance and locating features, such as align strips 380, 382 to positively locate holder 270 with respect to frame 350. Tilt axis assembly 354 is shown directly coupled to swing axis 352 and door assembly 356 resulting in a rigid coupling between door assembly 356 and swing axis 352. With swing axis 352 open, tilt axis 354 may selectively rotate the wafer chuck assembly 370 to a horizontal, vertical or intermediate position for wafer transfer, positioning or otherwise. Tilt axis 354 may utilize a closed loop servomotor controlled with a 100:1 harmonic drive or other suitable drive as will be described. As will be described, a counter weight may be provided to balance the load on the tilt axis drive where in the event of power loss or otherwise the tilt axis may not back drive. As will be described in greater detail below, chuck assembly 370 may be provided within door assembly 356 where the combination of door assembly and chuck assembly 370 may have one or more features allowing chuck assembly 370 to be axially moved relative to tilt axis 354. In the embodiment shown, swing and tilt axes 352, 354 move door assembly 356 containing chuck 370 in an accurate, clean and stiff fashion facilitating clean and efficient transport of substrates. The door assembly 356 is shown in an open position in FIGS. 7-8 and may be moved to a closed position wherein the wafers transported by the loader 274 may be transferred between loader and holder as will be described in greater detail below (see also FIG. 17). As will be described in greater detail below, door assembly 356 includes a bearing for contact ring seal lock and unlock that is tightly integrated within the envelope of door assembly 356 making for a stiff and accurate rotation axis driven by an air cylinder or linear stepper or otherwise. Further, door assembly 356 may have a secondary translation bladder and guide assembly, or other suitable transport device, as will be described to provide a final linear translation engagement of the contact ring seal studs into the spring plate. Further and as will be described, door assembly 356 may have guidance and constraint of the contact ring seal axial engagement motion and chuck engagement motion resulting in minimized or eliminated play, for example, to maintain parallelism between the contact ring seal 300 and chuck 370 and the respective reference surfaces of the holder 270 and wafer 278 during actuation with their respective bladders. As will also be described, door assembly 356 is shown having potential particle generating components located on the outboard side of door assembly 356 and away from substrate 278, such as, opposite the contact ring seal engagement and chuck side of door assembly.

As seen in FIG. 7, door assembly otherwise also referred to herein as the substrate transport (two are shown for exemplary purposes, but alternate embodiments may have more or less) 356 has features which are engaged or clamped by the cylinders or locking features (also referred to as clamps herein) 358, 360 on holder guide 380 and further to mount door assembly 356 to the tilt swing axis' 354 where the features (for example rigid blocks, mounting pattern and/or otherwise) in combination with the cylinders 358, 360 and the tilt and swing axis' 352, 354 provide a rigid 3, 4 point or other suitable reference with respect to the holder roller guides 380, 382. As such a rigid and repeatable reference with respect to holder 270 results in repeatable, accurate and clean substrate transfers. Thus, the door assembly and anything transported thereby (eg. a substrate chuck) may be deterministically positioned with respect to a desired reference or datum of the frame (eg. a desired encasement surface on the holder 270). Frame 350 may be rotationally coupled to base 362 by spin axis 364. Spin axis 364 (see FIG. 10) has bearing 366 stepper and for example 30:1 planetary drive 268 and belt drive 372. In alternate embodiments, any suitable drive may be provided, servo, directly coupled, with any suitable transmission or otherwise coupled or controlled. Further, spin axis 364 may have stops, home sensors, limit sensors, tensioners or other suitable components. Base 362 may have mounting features, for example, rigidly coupled plate 374, to rigidly mount and reference other devices, for example, pick up and flip device 282 or otherwise with respect to base 362 where servicing either should minimize the need to teach, align or reference the loader and the pick up and flip device 282 relative to each other. In alternate embodiments, any suitable reference or mounting for any suitable component may be provided for ease of setup and serviceability or otherwise. In the embodiment shown, each of the respective axis may be servo controlled or otherwise controlled to selectively position chuck assembly 370 with respect to base 362 and holder 270.

In the exemplary embodiment, and as described in greater detail, substrate loader 274 is shown adapted to load and unload substrate 278 to and from moveable holder 270, with substrate 278, when captured by the moveable holder 270, being contacted on a first side by moveable holder 270 and by seal 310 on a second side opposite the first side as seen in FIG. 3. Substrate loader 274 has base 362 and holder support frame 350 coupled to base 362 with holder support frame 350 adapted to repeatably position moveable holder 270 relative to a predetermined datum. The predetermined datum may be any suitable locating or guidance features, for example features within or external to left and right frame members 380, 382. For example, the external surface of members 380, 382 may provided a suitable predetermined datum. In alternate embodiments, any suitable predetermined datum may be provided. Substrate transport 356 is shown coupled to base 362, for example, via holder support frame 350 and having non-contact substrate chuck 370 and adapted to move and transport substrate 278 relative to holder 270 where the non-contact substrate chuck 370 may be moveable relative to a substrate transport frame 554. Here substrate transport or door assembly 356 is deterministically positioned relative to the predetermined datum, for example via a rigid three point coupling 358', 360' 352/354 or via any other suitable mechanism to deterministically position transport 356 relative to the predetermined datum. Transport 356 is shown adapted to move the substrate from a first position, for example, 370 in FIG. 17, with substrate 278 captured by moveable holder 270, to a second position, for example, 370' in FIG. 17, or an otherwise opened position (see also FIG. 7) with substrate 278 disengaged from holder 270 and seal 300, the substrate transport movement of the substrate from the first to the second position effecting disengagement from holder 270 and seal 300 substantially without contacting substrate 278. Here, substrate transport movement of substrate 278 from the first to the second position effects disengagement from holder 270 and seal 300 effected when moving from the first to the second positions with substrate 278 held by non-contact substrate chuck 370 and without contact between the non-contact substrate chuck 370 and substrate 278 during disengagement. Here, substrate transport 356 is adapted to transport substrate 278 from a first position with substrate 278 held by the moveable holder 270 to a second position with substrate 278 held by the non-contact substrate chuck 370 and disengaged from the holder 270 and the seal 300. Substrate transport frame 554 is coupled to and fixed with respect to the holder support frame 350 when the substrate is transferred from the holder 270 to the substrate transport 356, with the substrate transport 356 effecting disengagement of substrate 278 from holder 270 and seal 300 without contacting substrate 278.

In the embodiment shown, loader 274 may use chuck 370 with filter 378 that handles substrates in a noncontact fashion, for example, during transport and during engagement and disengagement with contact ring seal 300 and holder 270. Chuck 370 facilitates transport and desticking of seals without contact between substrate 278 and chuck 370. In the embodiment shown, chuck 370 may be a Bernoulli chuck as described in U.S. Provisional Patent Application No. 61/504,942 filed Jul. 6, 2011 and entitled Substrate Loader and Unloader Having a Bernoulli Support which is hereby incorporated by reference herein in its entirety. In the exemplary embodiment, chuck 370 may also be an air bearing chuck as described in U.S. Provisional Patent Application No. 61/504,920 filed Jul. 6, 2011 and entitled Substrate Loader and Unloader Having an Air Bearing Support which is hereby incorporated by reference herein in its entirety. Here, chuck assembly 370 may utilize a Bernoulli type chuck or an air bearing chuck substantially interchangeably as will be described, for example, where substrate chuck 370 may be either an interchangeable noncontact Bernoulli chuck or an interchangeable noncontact air bearing chuck. Here, chuck assembly 370 mounts, for example as a modular unit, into door assembly 356 where door assembly 356 handles both the wafer and contact ring seal interface. In the embodiment shown, door assembly 356 may functionally align wafers against an alignment feature, for example, on seal, alignment bosses or otherwise. Further, door assembly 356 may functionally hold the wafer in a fixed location while being loaded onto the holder via the loader and may engage/disengage and lock/unlock the contact ring seal with respect to the wafer holder. In operation, tilt axis 354 rotates substrate 278 from a horizontal attitude to a vertical attitude where swing axis 352 rotates door assembly 356 into a position with chuck 370 parallel to the wafer or contact ring seal engagement surface of holder 270. The position of door assembly 356 is locked with respect to frame 350 where for example two (or more or less) cylinders or other suitable devices 358, 360 on align strip 380 opposing align strip 382 engage door assembly 356 forming a rigid three point coupling or other suitable coupling between the align strips 380, 382 and door assembly 356. Here, substrate transport 356 is shown rigidly coupled to holder support frame 350 on opposing sides of substrate 278 proximate substrate 278. Here, substrate transport 356 is shown rigidly coupled to the holder support frame 350 by first and second mounting points 358, 360 and 352, 354 with a first mounting point 358 or 360 or both decoupleable from substrate transport 356. In the embodiment shown, swing axis 352 may mount for example directly to align strip 382 and may swing door assembly 356 away from wafer holder 270 for wafer transfer. Further, swing axis 352 may be additionally mounted and coupled directly to align strip 380 and via clamps 358, 360 during interface with wafer holder 270. Here, swing axis 352 is referenced to the same structure (frame 350 via strips 380, 382) that references holder 270 resulting in a stiff, tightly referenced position of chuck 370 within door assembly 356 with respect to holder 270 within align strips 380, 382, having both been referenced by align strips 380, 382. As will be shown, both swing axis 352 and tilt axis 354 may utilize a common closed loop servomotor controlled for example with a 100:1 harmonic drive or other suitable drive, thereby driving the door assembly position with high resolution position feedback with selectively high speed motion profiles and high resolution positioning. Additionally, as will be described, swing axis 352 and tilt axis 354 may utilize limit stops and reference and over travel sensors.

An exemplary loading operation may begin with transporter 214 load holder 270 having one or more wafers into frame 350 and a service connection 384 for air, nitrogen or otherwise is actuated. With door assembly 356 moved from the open to the closed position and locked by features 358, 360, vacuum ring 386 and chuck 370 within door 356 are moved, for example axially, toward holder 270 where vacuum ring 386 grips contact ring seal 300. The spring plate within holder 270 is actuated and vacuum ring 386 and chuck 370 within door 356 are rotated to disengage the lock pins from the keyholes. Vacuum ring 386 and chuck 370 within door 356 are axially moved away from holder 270 where vacuum ring 386 extracts contact ring seal 300 from holder 270 and where chuck 370 extracts substrate 278 from holder 270 without contact. In the exemplary embodiment controller 222 may be programmed so that the door assembly 356 and more specifically for example vacuum ring 386 and chuck 370 may effect extraction of the contact seal ring and substrate 278 together as a unit from the holder 270, as will be described further below. In alternate embodiments, extraction may be effected so that contact ring seal extraction may be separate (e.g. before) the extraction of the wafer from the holder by the loader. Clamps 358, 360 are released and the door assembly rotated by swing axis 352 and rotated to an open position, such as in a horizontal attitude by tilt axis 354. As will be described, substrate 278 may be separated from contact ring seal 300 in a de-stick operation effected by the controller with non-contact chuck 370, without contact between chuck 370 and substrate 278. For example, moving chuck 370 axially relative to vacuum ring 386 separates substrate 278 from contact ring seal 300. In operation, during load and unload sequences, chuck 370 may be angled with respect to horizontal, for example, to provide for alignment of substrate 278 with alignment bosses 332 on contact ring seal 300. Pick up and flip device 282 may remove a processed or dummy substrate 278 from loader 274 and may provide an unprocessed or other substrate for loading where the loading sequence may be opposite the unloading sequence or otherwise. The disclosed embodiments overcome seal to wafer interface stiction in the loader with chuck 370 where chuck 370 may be applied to overcome adhesion forces between the wafer and contact ring seal that seals the peripheral edge of the wafer within the edge exclusion zone and isolates the backside of the wafer from process chemistry during processing. Here, wafers may tend to stick to the seal (stiction) and may pop or create particles when the two are improperly separated and disengaged. The disclosed embodiments may be applied generally to sealing surfaces and substrates.

Figure 17:
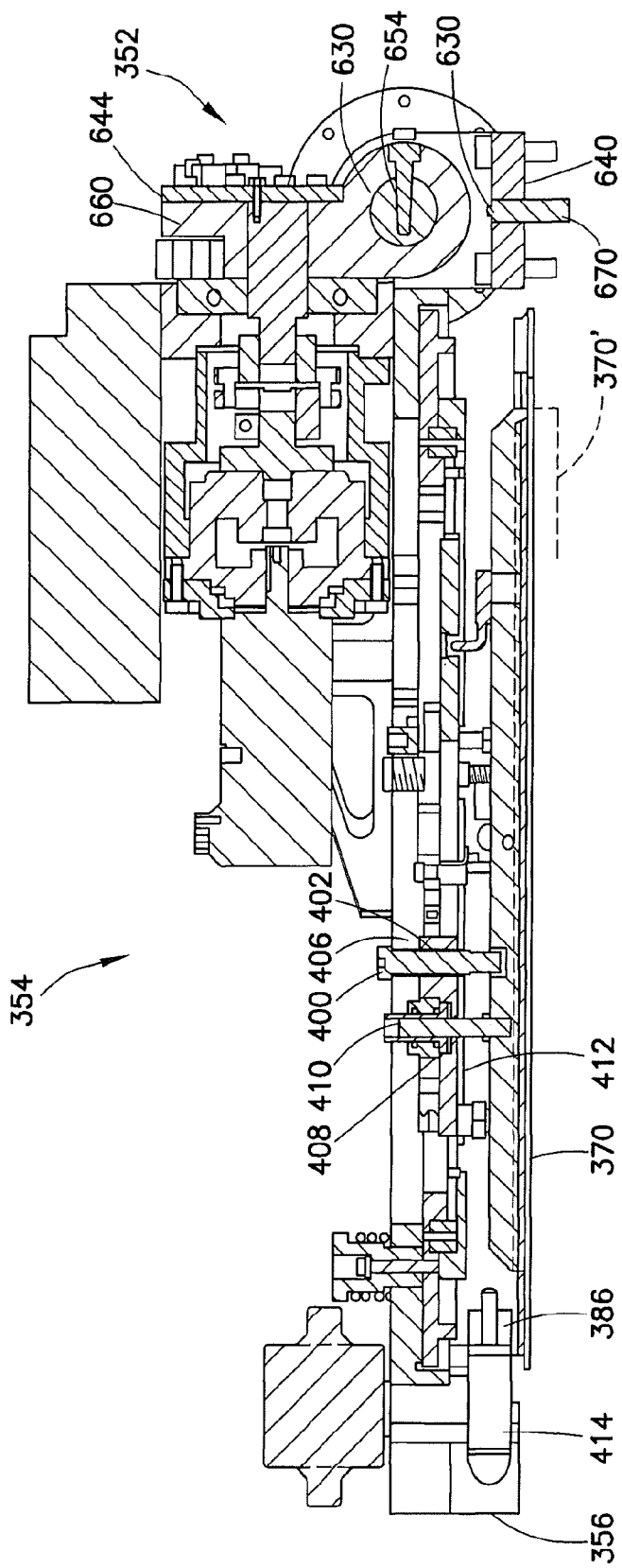
FIG. 17 shows a section view of a door assembly and a swing and a tilt axis.

Referring also to FIG. 17, there is shown a section view of a swing, tilt and door assembly with chuck 370 and vacuum ring 386. In the embodiment shown and as will be described in greater detail below with respect to a first exemplary loading and unloading sequence, the surface of chuck 370 may have a Bernoulli surface with regions of air bearing pressure where Bernoulli pressure may be selectively switched on and off to selectively attract wafer 278 (for example, where chuck 370 is retracted) or to selectively float or repel wafer 278 (for example, where chuck 370 is extended as shown in position 370'). Further, vacuum ring 386 has vacuum port 414 where vacuum may selectively be switched on and off to selectively attract contact ring seal 300. In the exemplary embodiment, an exemplary process flow for wafer holder loader 270 loading and unloading where chuck 370 does not contact substrate 278 via selective gas pressure on and off of an exemplary Bernoulli chuck 370 may be as follows:

Wafer 278 placement onto contact ring seal 300: With vacuum ring 386 vacuum on and chuck 370 gas off and with tilt axis 354 rotated such that chuck 370 is in a horizontal and retracted (via inflation of bladder 412) attitude and with contact ring seal 300 held with vacuum ring 386, wafer 278 is placed on chuck 370 and contact ring seal 300 via pick up and flip device 282 or otherwise.

Float: With chuck 370 gas on, chuck 370 extends (via deflation of bladder 412) supporting substrate 278 in a non contact fashion.

Tilt: With chuck 370 gas on, tilt axis 354 is rotated 15 degrees or otherwise using gravity to float substrate against ring seal alignment bosses 332 where upon completion of the tilting motion, chuck 370 retracts.

Vertical: With chuck 370 gas on, tilt axis 354 is rotated to vertical. Substrate 278 is held against contact ring seal 300 with Bernoulli force.

Swing and Lock: With chuck 370 gas on, swing axis 352 is rotated such that contact ring seal 300 and substrate 278 are parallel with corresponding features on holder. Clamps 358, 360 are engaged locking door assembly 356 in position.

Shuttle in: With chuck 370 gas on, secondary bladder 552 (as will be described with respect to FIG. 14) is deflated causing contact ring seal 300 to engage holder 270 as in FIG. 6A. Substrate 278 is held against contact ring seal 300 with Bernoulli force.

Clamp stud engagement: With chuck 370 gas on, spring plate 340 is extended as in FIG. 6B.

Rotation and lock: With chuck 370 gas on, where spring plate 340 is extended as in FIG. 6B, chuck 370 and ring 300 are rotated to engage keyhole features 344 as shown in FIG. 6C and the spring plate 340 is retracted as in FIG. 6C locking the substrate 278 and contact ring seal 300 in a clamped position.

Shuttle out: With chuck 370 gas off and vacuum ring 386 vacuum off, secondary bladder 552 (as will be described with respect to FIG. 14) is inflated causing vacuum ring 386 to disengage contact ring seal 300 and chuck 370 to disengage substrate 278. Unload sequence for the same substrate follows.

Shuttle in: With chuck 370 gas off, secondary bladder 552 (as will be described with respect to FIG. 14) is deflated causing contact vacuum ring 386 to engage ring seal 300 on holder 270. Vacuum for vacuum ring 386 is turned on coupling contact ring seal 300 to vacuum ring 386. Here, chuck 370 remains retracted.

Rotation and unlock: With chuck 370 gas on, contact ring seal 300 is unlocked and rotated with respect to holder 270 as shown sequentially in FIG. 6C, FIG. 6B and FIG. 6A.

Shuttle out: With chuck 370 gas on and with vacuum ring 386 vacuum on, secondary bladder 552 (as will be described with respect to FIG. 14) is inflated causing contact ring seal 300 and chuck 370 with substrate 278 to disengage holder 270.

Unlock, Swing and Tilt Horizontal: Clamps 358, 360 are unclamped releasing door assembly 356 with respect to frame 350. With chuck 370 gas on, swing axis 352 is rotated and tilt axis 354 rotated such that substrate 278 is in a horizontal attitude clear of holder 270.

Destick: With chuck 370 gas on, chuck 370 extends (via deflation of bladder 412) and retracts (via inflation of bladder 412) to provide destick of substrate 278 with respect to seal 310 of contact ring seal 300. Chuck 370 gas is turned off after destick and retract.

Wafer Transfer Chuck 370 is retracted (via inflation of bladder 412) with chuck gas switched off, substrate 278 may be removed by pick up and flip device 282 or otherwise.

In alternate embodiments, the aforementioned process may be performed in any suitable order or combination of actions as desired. In the embodiment described, in the "shuttle in" action above, seal 300 may be coupled to holder 270 with substrate 278 in a first position, and in the "de-stick" action seal 300 may be disengaged from holder 270 and coupled to substrate transport 356 with substrate 278 in a second position. Referring still to FIG. 17, there is shown a section view of a swing, tilt and door assembly with chuck 370 and vacuum ring 386. In the embodiment shown and as will be described in greater detail below with respect to a second exemplary loading and unloading sequence, the surface of chuck 370 may have an air bearing surface that has regions of vacuum and air bearing pressure where vacuum may be selectively switched on and off to selectively attract wafer 278 and where pressure may selectively be switched on and off to selectively float or repel wafer 278. Further, vacuum ring 386 has vacuum port 414 where vacuum may selectively be switched on and off to selectively attract contact ring seal 300. In the exemplary embodiment, an exemplary process flow for wafer holder loader 270 loading and unloading where chuck 370 does not contact substrate 278 via combination air bearing (selective gas pressure on and off) and vacuum (selective vacuum on and off) of chuck 370 may be as follows:

Wafer 278 placement onto contact ring seal 300: With vacuum ring 386 vacuum on and chuck 370 vacuum and gas off and with tilt axis 354 rotated such that chuck 370 is in a horizontal and retracted attitude (via inflation of bladder 412) and with contact ring seal 300 held with vacuum ring 386, wafer 278 is placed on chuck 370 and contact ring seal 300 via pick up and flip device 282 or otherwise. Float: With chuck 370 gas on and vacuum off, chuck 370 extends (via deflation of bladder 412) supporting substrate 278 in a non contact fashion.

Tilt: With chuck 370 gas on and vacuum off, tilt axis 354 is rotated 15 degrees or otherwise using gravity to float substrate against ring seal alignment bosses 332 where upon completion of the tilting motion, chuck 370 vacuum is then turned on.

Vertical: With chuck 370 gas on and vacuum on, tilt axis 354 is rotated to vertical.

Swing and Lock: With chuck 370 gas on and vacuum on, swing axis 352 is rotated such that contact ring seal 300 and substrate 278 are parallel with corresponding features on holder. Clamps 558, 360 are engaged locking door assembly 356 in position.

Shuttle in: With chuck 370 gas on and vacuum on, secondary bladder 552 (as will be described with respect to FIG. 14) is deflated causing contact ring seal 300 to engage holder 270 as in FIG. 6A.

Clamp stud engagement: With chuck 370 gas on and vacuum on, spring plate 340 is extended as in FIG. 6B. Here, the actual position of chuck 370 is determined by springs and the counter force of substrate 278 with respect to the air bearing surface of chuck 370.

Rotation and lock: With chuck 370 gas on and vacuum off, where spring plate 340 is extended as in FIG. 6B, chuck 370 and ring 300 are rotated to engage keyhole features 344 as shown in FIG. 6C and the spring plate 340 is retracted as in FIG. 6C locking the substrate 278 and contact ring seal 300 in a clamped position. Here, the actual position of chuck 370 is determined by springs and the counter force of substrate 278 with respect to the air bearing surface of chuck 370.

Shuttle out: With vacuum ring 386 vacuum off, secondary bladder 552 (as will be described with respect to FIG. 14) is inflated causing vacuum ring 386 to disengage contact ring seal 300 and chuck 370 to disengage substrate 278 where gas is then turned off. Unload sequence for the same substrate follows.

Shuttle in: With chuck 370 gas on and vacuum on, secondary bladder 552 (as will be described with respect to FIG. 14) is deflated causing contact vacuum ring to engage ring seal 300 on holder 270. Vacuum for vacuum ring 386 is turned on coupling contact ring seal 300 to vacuum ring 386. Here, the actual position of chuck 370 is determined by springs and the counter force of substrate 278 with respect to the air bearing surface of chuck 370.

Rotation and unlock: With chuck 370 gas on and vacuum on, contact ring seal is unlocked and rotated with respect to holder 270 as shown sequentially in FIG. 6C, FIG. 6B and FIG. 6A.

Shuttle out: With chuck 370 gas on and vacuum on and with vacuum ring 386 vacuum on, secondary bladder 552 (as will be described with respect to FIG. 14) is inflated causing contact ring seal 300 and chuck 370 with substrate 278 to disengage holder 270.

Unlock, Swing and Tilt Horizontal: Clamps 358, 360 are unclamped releasing door assembly 356 with respect to frame 350. With chuck 370 gas on and vacuum on, Swing axis 352 is rotated and tilt axis 354 rotated such that substrate 278 is in a horizontal attitude clear of holder 270.

Destick: With chuck 370 gas on and vacuum off and chuck 370 extended destick of substrate 278 with respect to seal 310 of contact ring seal 300 is accomplished (via deflation of bladder 412).

Wafer Transfer Chuck 370 is retracted (via inflation of bladder 412) with chuck gas subsequently switched off and with vacuum off, substrate 278 may be removed by pick up and flip device 282 or otherwise.

In alternate embodiments, the process may be carried out in any suitable order or combination of actions as desired. During and unload operation where substrate 278 is removed from holder 270 and where substrate 278 is separated from contact ring seal 300, wafer 278 may stick to the contact ring seal 300. This effect may be due to loss of anti-stick coating on the contact ring seal 300 or to chemical interactions between contact ring seal 300 Viton® and photo-resist on the wafer or otherwise as will be described in greater detail below. In the disclosed embodiments, an exemplary loader 274 system utilizes an air bearing or Bernoulli chuck 370, in which the force between the chuck surface and the wafer is so large that it is not possible to touch the wafer. In the embodiment shown in FIG. 17, chuck 370 is shown in a retracted position (down or inward) whereas the position exemplified by chuck 370' is shown in an extended (up or outward) position. Here, chuck 370 is axially moveable with respect to contact ring seal vacuum ring 386 where shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly, for example, during a de-stick operation where the face of chuck assembly 370 remains substantially parallel with the suction and locating feature 404 of ring assembly 386 during motion regardless of the orientation or location of the origin of a de-stick between a substrate and a contact ring seal held by feature 404 and regardless of the propagation of the d-estick. In alternate embodiments, any suitable mechanism, such as combinations of slides bushings or any suitable guide or otherwise may be provided to constrain chuck assembly 370 substantially parallel with ring assembly 386 during motion. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the extended or up position 370' which corresponds to a position where bladder 412 is deflated. Alternately, where bladder 412 is inflated, chuck 370 is axially moved to the retracted location shown in FIG. 17. A similar guidance and constraint approach is provided for engagement of the contact ring seal assembly with the holder utilizing a secondary bladder as described below. One or more de-stick operations may be done after process operations during unload of processed wafers where a second de stick operation may be used to remove wafer 278 from wafer holder 270. Here, de-stick #1 may be removing wafer 278 from wafer holder 270 (FIG. 3, seal 318) and de-stick #2 may be removing wafer 278 from the sealing ring 300. Stiction may come from different sources. For example, some wafer holders may have o-rings, gaskets or seals within them in addition to the contact ring seal 310 which may adhere to the wafer and prevent proper handling. In the embodiment shown, loader 274 is provided with exemplary embodiments of chuck 370 and with a controllable non contact force in combination of a force and motion profile that may be stored in controlled memory and effected by suitable controller programming that provides destick without contact over a range of desired conditions.

Figure 11:
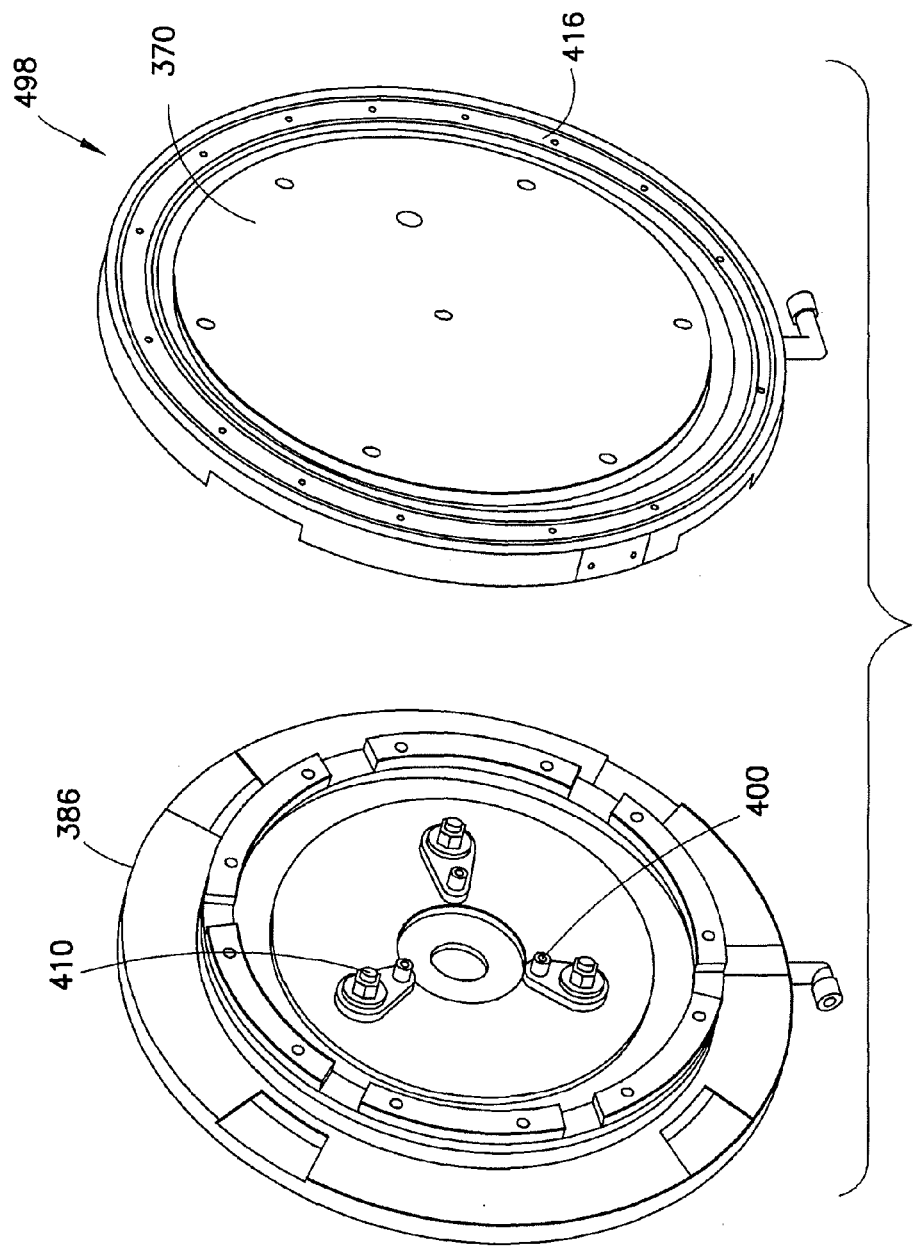
FIG. 11 shows an isometric view of an interchangeable chuck assembly.
Figure 12:
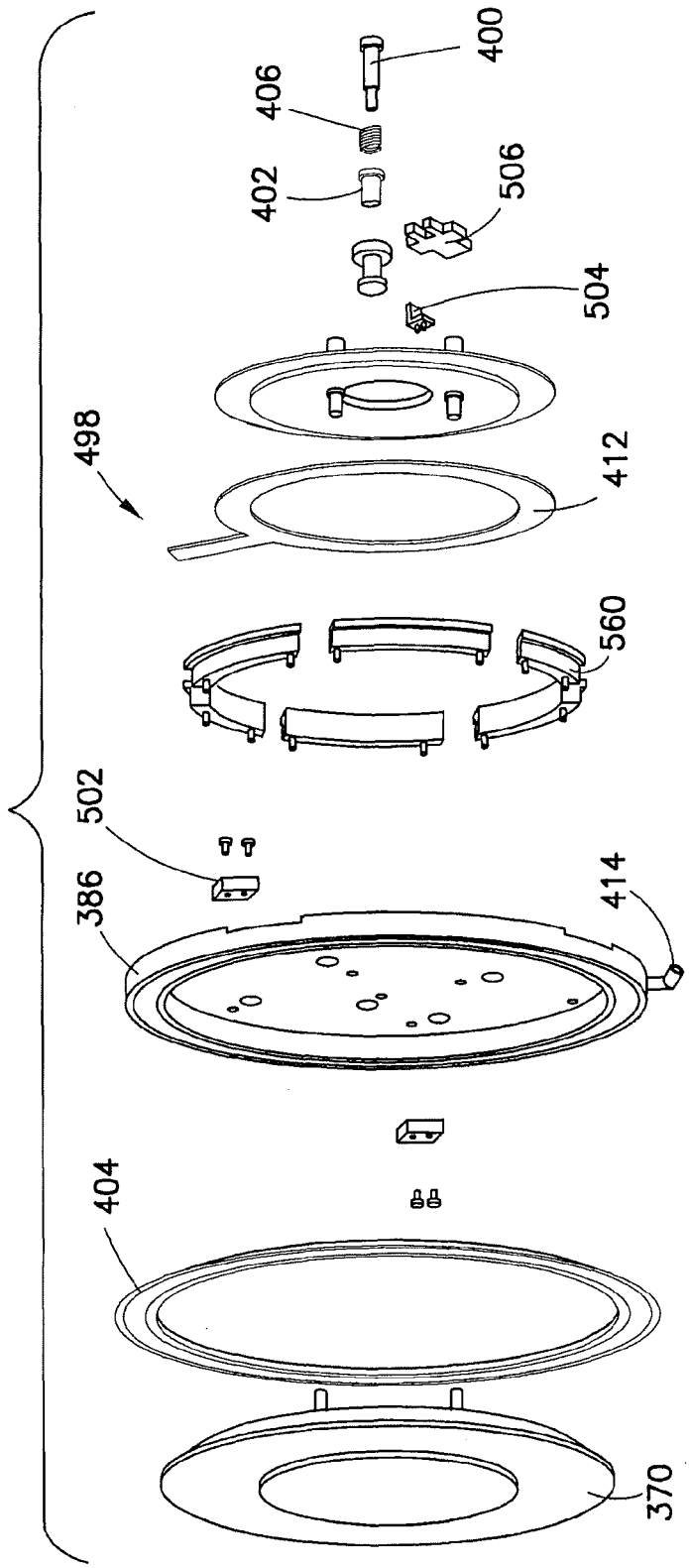
FIG. 12 shows an exploded isometric view of a chuck assembly.

Referring now to FIG. 11, there is shown an isometric view of a representative chuck and ring assembly 498 with an interchangeable chuck assembly 370 and contact ring seal vacuum ring 386. Referring also to FIG. 12, there is shown an exploded isometric view of a chuck and ring assembly 498. The interchangeable chuck assembly shown is representative, and the interchangeable chuck assembly may be either an air bearing chuck or a Bernoulli chuck as previously noted. In the embodiment shown, chuck 370 is axially moveable with respect to contact ring seal vacuum ring 386. Shoulder screws 400 are shown fastened and grounded to ring 386 and are shown in combination with flanged bearings 402 to constrain the surface of chuck assembly 370 to remain substantially parallel with ring assembly 386 during axial extension and retraction of the chuck assembly where the face of chuck assembly 370 remains substantially parallel with the suction and locating feature 404 of ring assembly 386 during motion regardless of the orientation or location of the origin of a destick between a substrate and a contact ring seal held by feature 404 and regardless of the propagation of the destick. In alternate embodiments, any suitable mechanism, such as combinations of slides bushings or any suitable guide or otherwise may be provided to constrain chuck assembly 370 substantially parallel with ring assembly 386 during motion. Here, contact ring seal vacuum ring 386 is provided with a Viton® vacuum ring 404 with contact ring seal vacuum ports 416, air bearing plate 370 and contact ring seal vacuum supply 414. Shoulder screws 400 may be provided with springs between their respective heads and backing plate 408 where backing plate 408 is coupled to chuck 370 with locking and jacking assemblies 410 that allow for fine adjustment, for example, leveling or otherwise of the surface location of chuck 370. Here, the springs 406 provide a preload and bias chuck 370 in the position shown in FIG. 14 which corresponds to a position where bladder 412 is deflated. Alternately, where bladder 412 is inflated, chuck 370 is axially moved to the location shown in FIG. 17. Bearing capture 500 may be provided to capture the inner race of a bearing as will be described with respect to FIG. 14 to allow the chuck assembly to rotate, for example, where the contact ring seal lock pins engage and disengage the keyholes of the holder and where lock stop 502 is provided to prevent overtravel. Flag 504 and photoelectric or other suitable sensor 506 may be provided to detect a position state of chuck 370 with respect to ring assembly 386.

Figure 13:
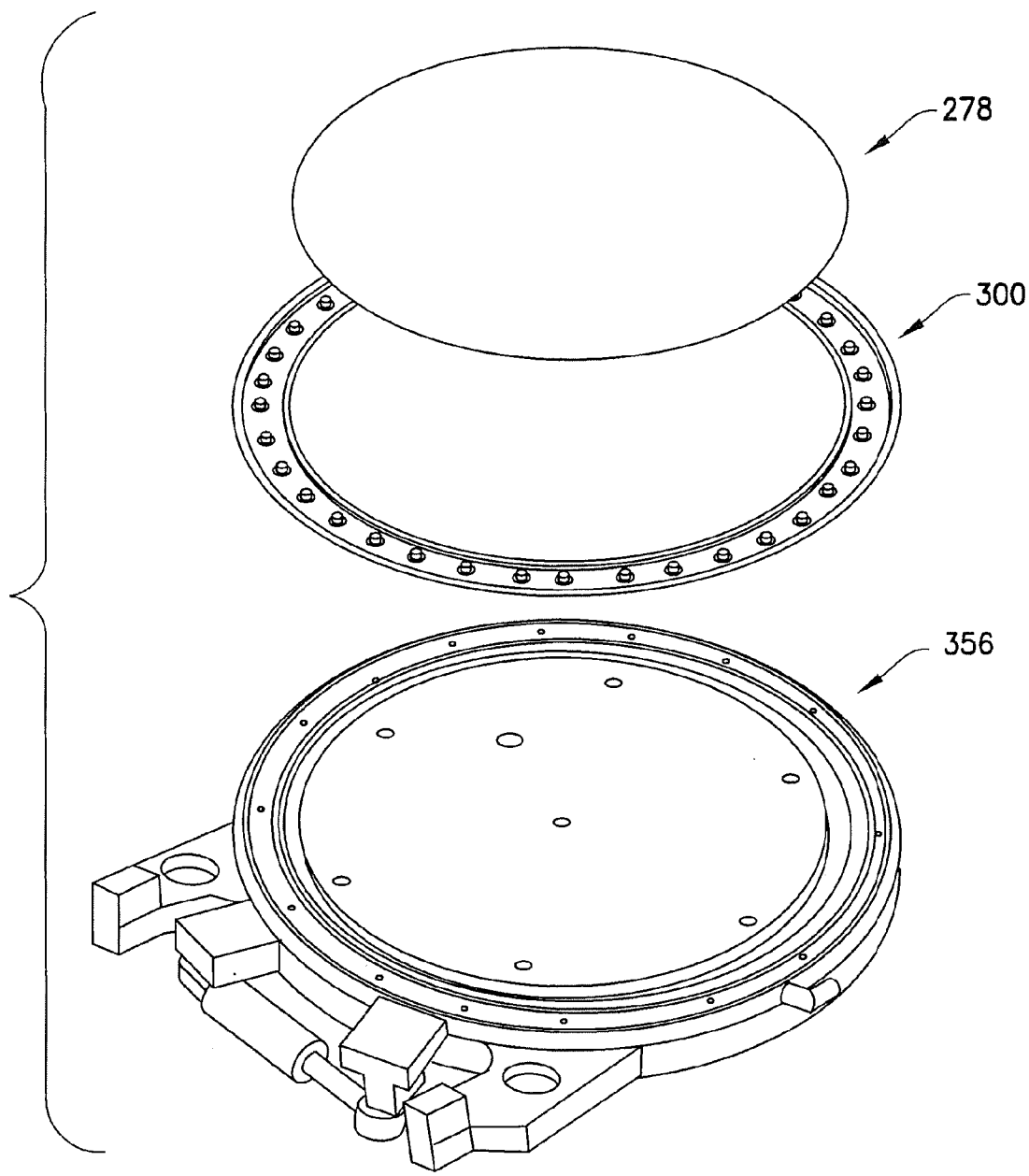
FIG. 13 shows an isometric view of a door assembly.
Figure 14:
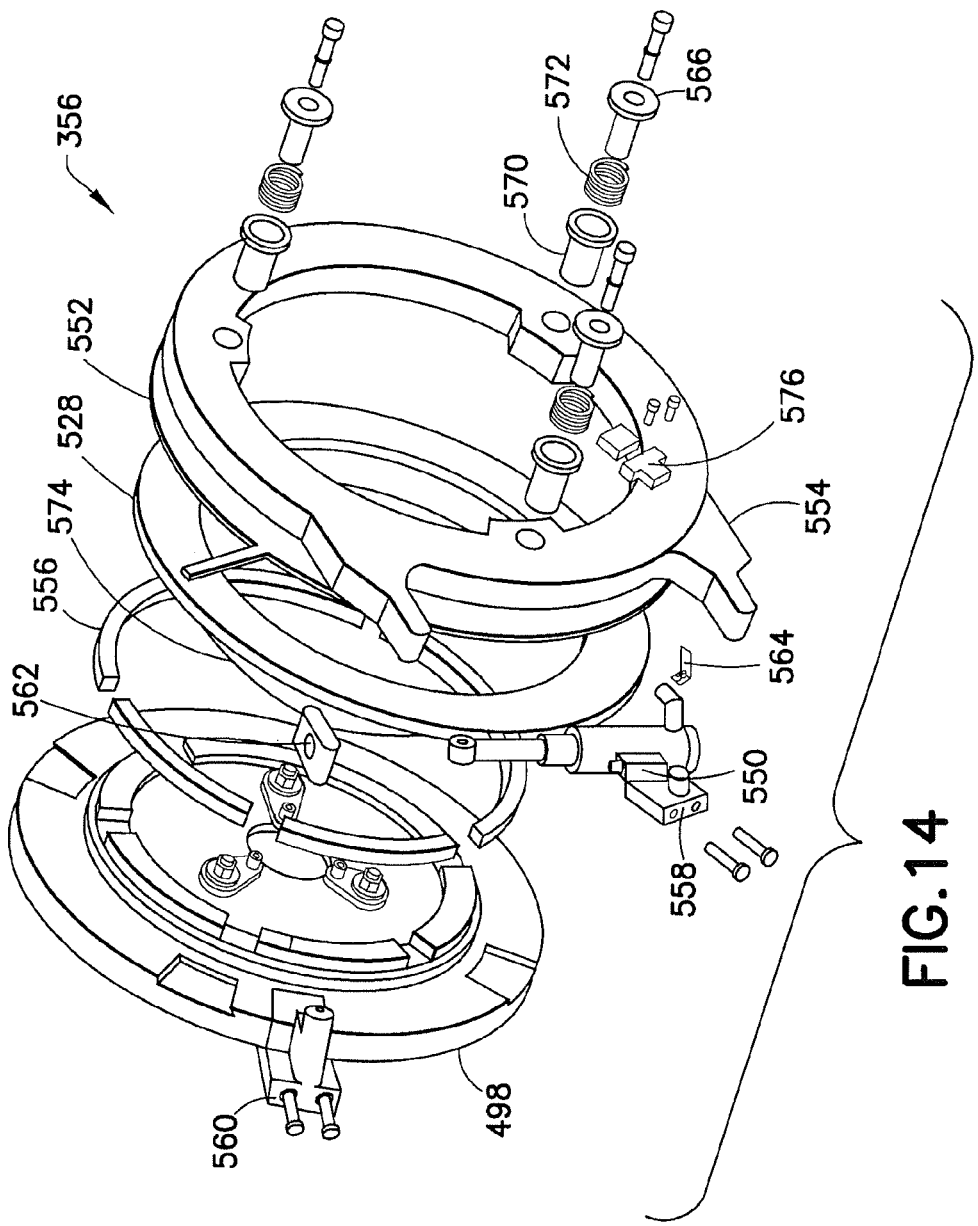
FIG. 14 shows an exploded isometric view of a door assembly.

Referring now to FIG. 13, there is shown an isometric view of a representative door assembly 356, contact ring seal 300 and substrate 278. Referring also to FIG. 14, there is shown an exploded isometric view of door assembly 356. In the embodiment shown, main door plate 554 may be grounded or coupled to swing axis 354 and engages, for example, clamps 358, 360 when loader 274 is performing a load or unload operation with respect to holder 270 (FIG. 7). The door assembly configuration illustrates for example purposes only, and in alternate embodiments the assembly and components may have any other desirable configuration. Translation plate 568 is coupled to main door plate 554 where door translation guides 566 are coupled to translation plate 568 and is axially moveable within flange bearings 570. Springs 572 bias translation plate 568 toward main door plate 554 as springs 572 are compressed between the shoulder on door translation guides 566 and the flange of flange bearings 570. Secondary bladder 552 is disposed between translation plate 568 and main door plate 554 where inflation separates translation plate 568 and main door plate 554 and where deflation biases translation plate 568 toward main door plate 554. Door translation flag 564 and photo electric sensor 576 are provided to detect the position state of translation plate 568 with respect to main door plate 554. Door translation guides 566 in combination with flange bearings 570 constrain the surface of translation plate 568 (and hence chuck assembly 370) to remain substantially parallel with the surface of main door plate 554 during axial extension and retraction of the translation plate 568 regardless of the orientation or location of the origin of a destick, for example from a substrate or contact ring seal or otherwise and regardless of the propagation of the destick. Chuck and ring assembly 498 is rotationally coupled to translation plate 568 by Bearing 574, for example, a 4 point Reali-Slim® 10.75" od×10" id bearing or otherwise where bearing capture plates 556 couple the outer race to translation plate 568 and where the inner race is coupled to Chuck and ring assembly 498 as previously described. Cylinder assembly 550 or any suitable actuator linear stepper or otherwise may have stops and or limit sensors and is coupled to Chuck and ring assembly 498 with moving cylinder mount 560 and is further coupled to main door plate 554 with fixed cylinder mount 558. Door lock block 562 may be provided, for example, to act as a stop or otherwise. In operation, the swing and tilt axes of loader 274 move the door assembly 356 where the door assembly includes bearing 574 for contact ring seal lock and unlock that is tightly integrated within the envelope of the door assembly 356 where secondary translation bladder 552 and guide assembly is provided for the final linear translation engagement of the contact ring seal studs into the spring plate. Here, guidance and constraint of the CRS axial engagement motion and chuck engagement motion minimize or eliminate play and maintain parallelism between the contact ring seal 300 and chuck 370 and the reference surfaces of the holder/wafer during actuation with their respective bladders. Here, substrate transport 356 has two independent axis of motion, for example as actuated by bladders 552 and 412 respectively with the substrate chuck 370 moveable in a common direction perpendicular to a surface of the substrate 278, and with a face of substrate chuck 370 constrained to remain parallel to the surface of the substrate 278 during motion of the substrate chuck 370 and during non-contact engagement of the substrate chuck 370 with the substrate 278.

Figure 15:
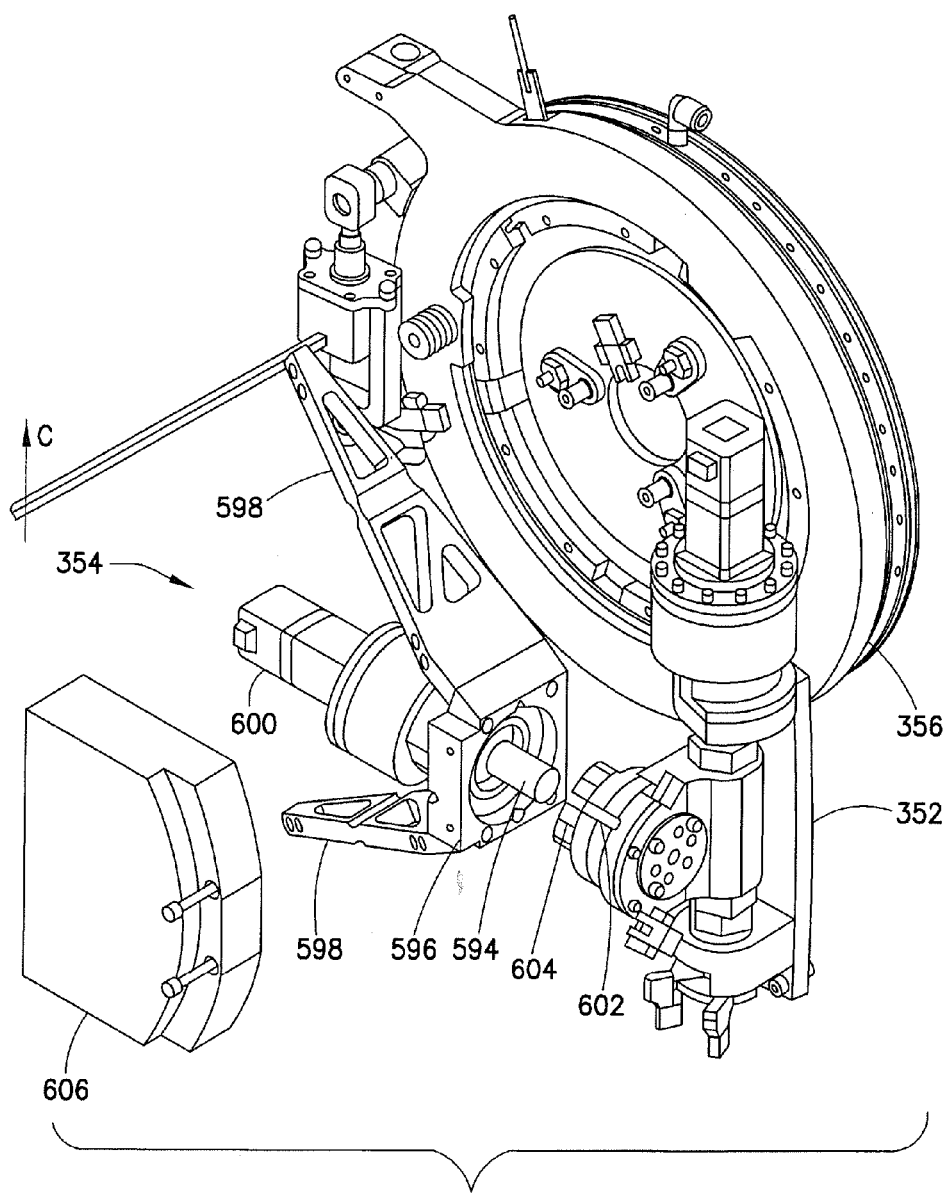
FIG. 15 shows an exploded view of a door assembly and a swing and a tilt axis.
Figure 16:
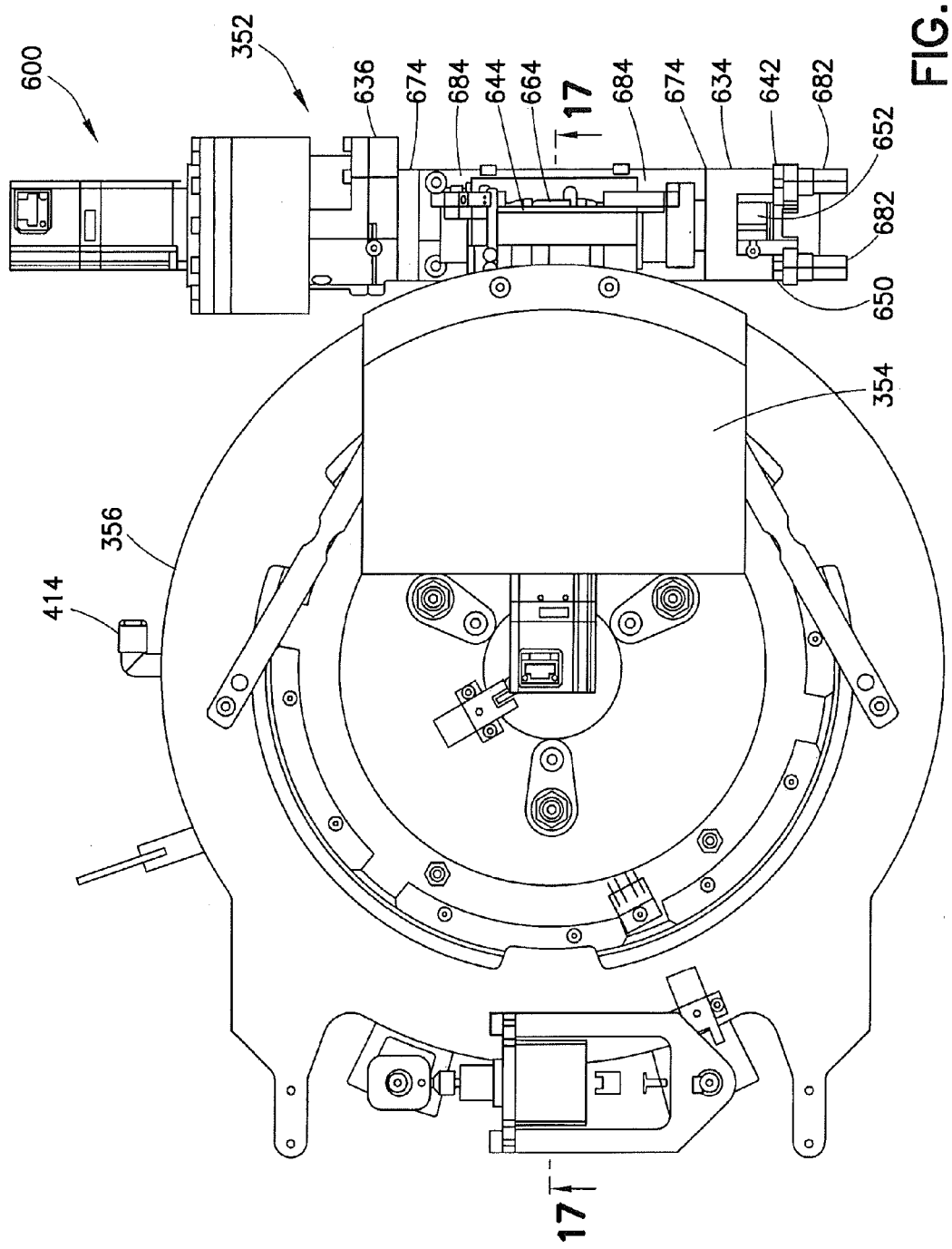
FIG. 16 shows a view of a door assembly and a swing and a tilt axis.
Figure 18:
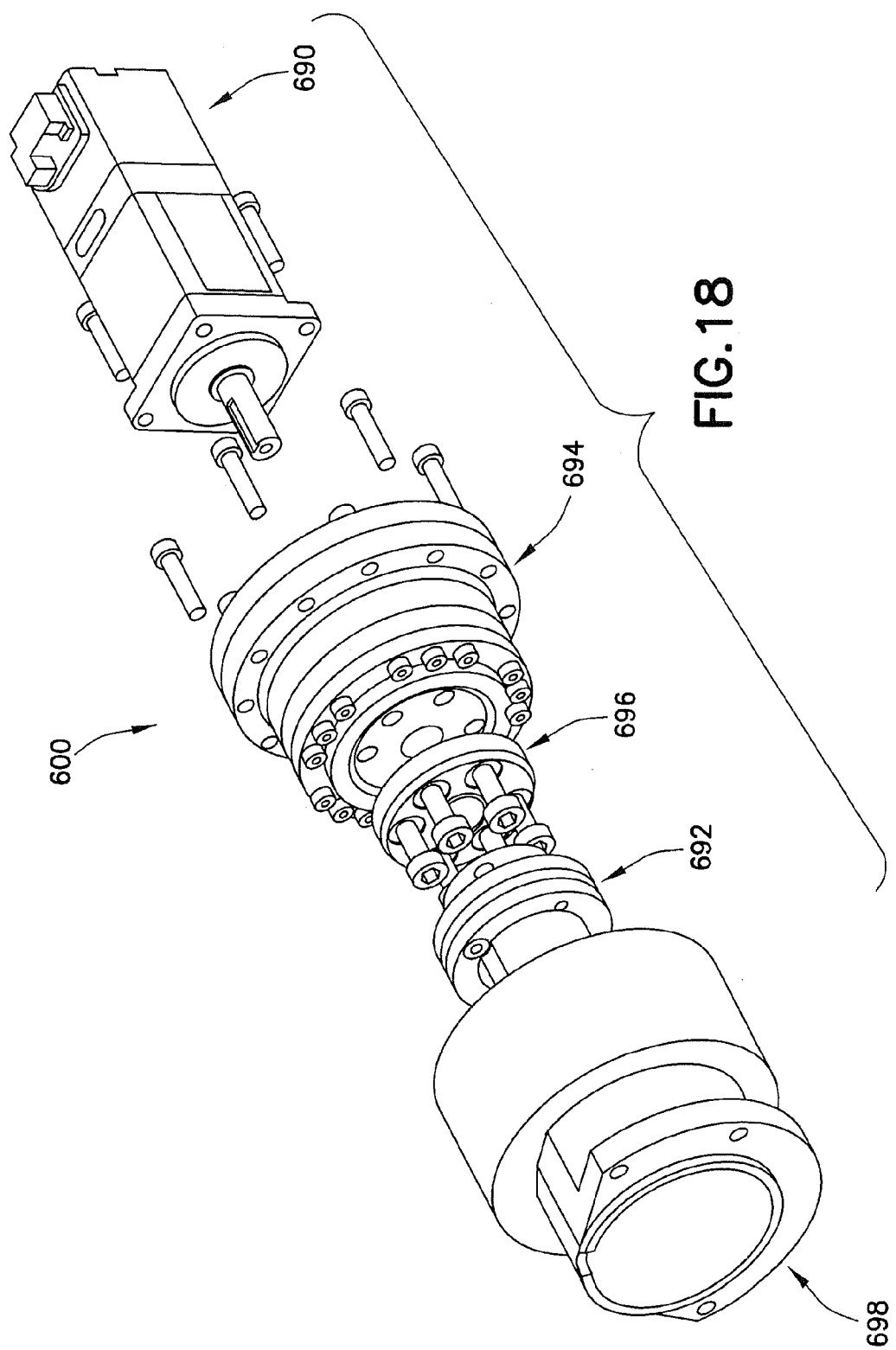
FIG. 18 shows a drive actuator assembly.

Referring now to FIG. 15, there is shown an exploded view of door assembly 356, swing axis 352 and tilt axis 354. In the embodiment shown, tilt motor assembly 354 has tilt axis shaft 594, mounting plate 596, mounting arms 598, motor assembly 600, tilt axis flag 602, tilt axis stop 604 and tilt counterweight 606. In the embodiment shown, mounting plate 596 and mounting arms 598 rigidly couple the outer housing of actuator 600 to door assembly 356 while tilt axis output shaft is rigidly coupled to swing drive 352. As such, the motor and housing of actuator 600 rotate with mounting plate 596, mounting arms 598 and door assembly 356. Counterweight 606 may be mounted to plate 596 to act in a manner where the combination of door assembly 356 and tilt assembly 354 center of gravity in the direction of the rotation axis of tilt drive 354 is substantially centered. Here, upon the loss of power, actuator 600 should not backdrive. As seen, substrate transport 356 has tilt drive 354 and swing drive 352, with swing drive 352 adapted to rotate the substrate from a first vertical position to a second vertical position and with the tilt drive 354 adapted to rotate the substrate from the second vertical position to a third horizontal position. Tilt axis flags 602 are provided as a reference and overtravel sensing with respect to relative motion between tilt axis 354 and swing axis 352. Similarly, tilt axis stop 604 may be provided as a stop with respect to relative motion between tilt axis 354 and swing axis 352. Referring also to FIG. 16, there is shown a view of a door assembly 356, swing axis 352 and tilt axis 354. Referring also to FIG. 17, there is shown a section view of a door assembly 356, swing axis 352 and tilt axis 354. In the embodiment shown, swing motor assembly 352 has motor assembly 600 which may be substantially the same as the motor assembly for tilt drive 354. Lower swing bearing mount 634 and upper swing bearing mount 636 are coupled to swing assembly mounting plate 640 forming a trunnion where swing assembly mounting plate 640 is coupled and grounded to guide 382 of frame 350 (FIG. 7) and where the housing of actuator 600 is grounded to upper swing bearing mount 636. Swing axis sensor mount 642 is coupled to lower swing bearing mount 634 and provides reference and overtravel sensing with respect to relative motion between the output shaft of swing axis 352 and guide 382. Tilt axis sensor mount 644 is coupled to tilt bearing carrier 660 providing mounting for tilt axis sensors 684 that cooperate with flag 602 of tilt axis drive 354 as previously described. Swing sensor flag 650 and swing axis stop 652 are coupled to swing axis shaft 654 and tilt bearing carrier 660 where swing axis shaft 654 and tilt bearing carrier 660 are coupled to the output shaft of actuator 600. Tilt shaft lock 664, dowel pin 670 and two double shielded bearings 674 rotationally couple the moving components of swing axis drive 352 to guide 382 via lower swing bearing mount 634 and upper swing bearing mount 636 as coupled to swing assembly mounting plate 640. Similarly, cross roller bearing 680 rotationally couples swing axis 352 to tilt axis 354. Photo electric sensors 684 cooperate with sensor flag 652 to provide reference and overtravel sense for swing axis 352. Similarly, stop 652 provides a stop for overtravel with respect to swing axis 352. Referring also to FIG. 18, there is shown a drive actuator assembly 600. In the embodiment shown, drive actuator assembly 600 has servo motor 690, flex coupling 692, harmonic drive 100:1 694, adapter 696 and mount sleeve 698. In the embodiment shown, servo motor 690 may have an encoder portion, a motor housing and an output shaft where the output shaft of motor 690 is coupled to the wave generator of harmonic drive 694 and where the housing of motor 690 is coupled to the circular spline of harmonic drive 694. The output of harmonic drive 694 is shown coupled to adapter 696 and flex coupling 692, forming the low speed output member of actuator 600. The circular spline of harmonic drive 694 is further grounded to housing 698 of actuator 600. In alternate embodiments, more or less components or different suitable components may be provided.

Referring now to FIG. 19, there is shown an exemplary flow diagram 800. Flow diagram 800 represents an exemplary method of loading a substrate to a holder by repeatably positioning 802 the holder relative to a predetermined datum as described previously. As noted before, in the embodiment shown the datum may be any suitable datum, for example features with respect to the holder frame, the base or otherwise. As illustrated in FIG. 19, a substrate may be placed 804 on a substrate transport. Here, placing may be by a substrate pick up and flip device rigidly coupled to the base or by other suitable transport. The substrate may be floated 806 with a substrate chuck of the substrate transport. Here, the substrate chuck may be an interchangeable non contact chuck, for example, interchangeable between a non-contact Bernoulli chuck and a non-contact air bearing chuck or otherwise. The substrate transport is deterministically positioned 808 relative to the predetermined datum. Here, the substrate transport may be rigidly coupled to the holder support frame or other suitable datum feature(s) on opposing sides of the substrate proximate the substrate, for example, with a three point coupling or otherwise. The holder may be engaged 810 with the substrate, thus capturing 812 the substrate with the holder. The substrate chuck may be retracted 814 from the substrate. In alternate methods, more or less features in alternate sequence and with more or less structure may be provided.

Referring now to FIG. 20, there is shown an exemplary flow diagram 900. Flow diagram 900 represents an exemplary method of un-loading a substrate from a holder by repeatably positioning 902 the holder relative to a predetermined datum. In the embodiment shown, the datum may be any suitable datum, for example features with respect to the holder frame, the base or otherwise. The substrate transport deterministically positioning 904 in a first position relative to the predetermined datum as previously described. Here, the substrate transport may be rigidly coupled to the holder support frame or other suitable datum feature(s) on opposing sides of the substrate proximate the substrate, for example, with a three point coupling or otherwise. The substrate may be engaged 906 with the non-contact substrate chuck. Here, the substrate chuck may be an interchangeable non contact chuck, for example, interchangeable between a non-contact Bernoulli chuck and a non-contact air bearing chuck or otherwise. The substrate transport may be moved from the first position to a second position, disengaging 908 the substrate from the holder. As previously described, movement of the substrate transport may be effected by retracting 910 the substrate chuck with the substrate from the holder, and rotating 912 the substrate to for example a horizontal attitude. As also described previously, movement of the substrate transport to the second position effects de-sticking 914 of the substrate with respect to a seal without contacting the substrate. In accordance with method 900, picking 916 of the substrate from the substrate transport may be effected, such as by a substrate pick up and flip device rigidly coupled to the base or by other suitable transport. In alternate methods, more or less features in alternate sequence and with more or less structure may be provided.

In accordance with a first aspect of the disclosed embodiment a substrate loader adapted to load and unload a substrate to and from a moveable holder, the substrate, when captured by the moveable holder, being contacted on a first side by the moveable holder and by a seal on a second side opposite the first side, the substrate loader comprises a base; a holder support frame coupled to the base, the holder support frame adapted to repeatably position the moveable holder relative to a predetermined datum; and a substrate transport coupled to the base and having a substrate chuck and adapted to move and transport the substrate relative to the holder. The substrate transport is deterministically positioned relative to the predetermined datum and is adapted to move the substrate from a first position, with the substrate captured by the moveable holder, to a second position with the substrate disengaged from the holder and the seal, the substrate transport movement of the substrate from the first to the second position effecting disengagement from the holder and the seal substantially without contacting the substrate.

In accordance with the first aspect of the disclosed embodiment wherein the seal is coupled to the holder with the substrate in the first position, and wherein the seal is disengaged from the holder and coupled to the substrate transport with the substrate in the second position.

In accordance with the first aspect of the disclosed embodiment wherein the substrate transport is rigidly coupled to the holder support frame on opposing sides of the substrate proximate the substrate.

In accordance with the first aspect of the disclosed embodiment wherein the substrate transport is rigidly coupled to the holder support frame by first and second mounting points, and wherein the first mounting point is decoupleable from the substrate transport.

In accordance with the first aspect of the disclosed embodiment wherein the substrate transport has two independent axis of motion with the substrate chuck moveable in a common direction substantially perpendicular to a surface of the substrate, with a face of the substrate chuck constrained to remain substantially parallel to the surface of the substrate during motion of the substrate chuck and during engagement of the substrate chuck with the substrate.

In accordance with the first aspect of the disclosed embodiment wherein the substrate transport has a tilt drive and a swing drive, with the swing drive adapted to rotate the substrate from a first substantially vertical position to a second substantially vertical position and with the tilt drive adapted to rotate the substrate from the second vertical position to a third substantially horizontal position.

In accordance with the first aspect of the disclosed embodiment wherein the substrate chuck comprises a noncontact Bernoulli chuck.

In accordance with the first aspect of the disclosed embodiment wherein the substrate chuck comprises a noncontact air bearing chuck.

In accordance with the first aspect of the disclosed embodiment wherein the substrate chuck comprises an interchangeable chuck, interchangeable between a non-contact Bernoulli chuck and a non-contact air bearing chuck.

In accordance with the first aspect of the disclosed embodiment a substrate pick up and flip device rigidly coupled to the base.

In accordance with a second aspect of the disclosed embodiment a substrate loader adapted to load and unload a substrate to and from a moveable holder, the substrate, when captured by the moveable holder, being contacted on a first side by the moveable holder and by a seal on a second side opposite the first side, the substrate loader comprises a base; a holder support frame coupled to the base, the holder support frame adapted to repeatably position the moveable holder relative to a predetermined datum; and a substrate transport coupled to the base and having a non-contact substrate chuck and adapted to move and transport the substrate relative to the holder. The substrate transport is deterministically positioned relative to the predetermined datum and is adapted to move the substrate from a first position, with the substrate captured by the moveable holder, to a second position with the substrate disengaged from the holder and the seal, the substrate transport movement of the substrate from the first to the second position effecting disengagement from the holder and seal, wherein the non-contact substrate chuck is configured so that disengagement from the holder and seal is effected when moving from the first to the second positions with the substrate held without contact by the non-contact substrate chuck.

In accordance with the second aspect of the disclosed embodiment wherein the seal is coupled to the holder with the substrate in the first position, and wherein the seal is disengaged from the holder and coupled to the substrate transport with the substrate in the second position.

In accordance with the second aspect of the disclosed embodiment wherein the substrate transport is rigidly coupled to the holder support frame on opposing sides of the substrate proximate the substrate.

In accordance with the second aspect of the disclosed embodiment wherein the substrate transport is rigidly coupled to the holder support frame by first and second mounting points, and wherein the first mounting point is decoupleable from the substrate transport.

In accordance with the second aspect of the disclosed embodiment wherein the substrate transport has two independent axis of motion with the non-contact substrate chuck moveable in a common direction substantially perpendicular to a surface of the substrate, with a face of the substrate chuck constrained to remain substantially parallel to the surface of the substrate during motion of the non-contact substrate chuck and during engagement of the non-contact substrate chuck with the substrate.

In accordance with the second aspect of the disclosed embodiment wherein the substrate transport has a tilt drive and a swing drive, with the swing drive adapted to rotate the substrate from a first substantially vertical position to a second substantially vertical position and with the tilt drive adapted to rotate the substrate from the second vertical position to a third substantially horizontal position.

In accordance with the second aspect of the disclosed embodiment wherein the non-contact substrate chuck comprises a non-contact Bernoulli chuck.

In accordance with the second aspect of the disclosed embodiment wherein the non-contact substrate chuck comprises a non-contact air bearing chuck.

In accordance with the second aspect of the disclosed embodiment wherein the non-contact substrate chuck is interchangeable between an interchangeable non-contact Bernoulli chuck and an interchangeable non-contact air bearing chuck.

In accordance with the second aspect of the disclosed embodiment a substrate pick up and flip device rigidly coupled to the base.

In accordance with a third aspect of the disclosed embodiment A substrate loader adapted to load a substrate to and from a moveable holder, the substrate, when captured by the moveable holder, being contacted on a first side by the moveable holder and by a seal on a second side opposite the first side, the substrate loader comprises a base; a holder support frame coupled to the base, the holder support frame adapted to repeatably position the moveable holder relative to a predetermined datum; and a substrate transport coupled to the holder support frame and deterministically positioned relative to the datum and having a substrate transport frame and a non-contact substrate chuck moveable relative to the substrate transport frame. The substrate transport is adapted to transport the substrate from a first position with the substrate held by the moveable holder to a second position with the substrate held by the non-contact substrate chuck and disengaged from the holder and the seal; and wherein the substrate transport frame is coupled to and fixed with respect to the holder support frame when the substrate is transferred from the holder to the substrate transport, the substrate transport effecting disengagement of the substrate from the holder and the seal without contacting the substrate.

It should be understood that the foregoing description is only illustrative of the invention. Various alternatives and modifications can be devised by those skilled in the art without departing from the invention. Accordingly, the present invention is intended to embrace all such alternatives, modifications and variances.

What is claimed is:

1. A substrate loader adapted to load and unload a substrate to and from a moveable holder, the substrate, when captured by the moveable holder, being contacted on a first side by the moveable holder and by a seal on a second side opposite the first side, the substrate loader comprising:
    a base;
    a holder support frame coupled to the base, the holder support frame adapted to repeatably position the moveable holder relative to a predetermined datum; and
    a substrate transport coupled to the base and having a substrate chuck and adapted to move and transport the substrate relative to the holder;
    wherein the substrate transport is deterministically positioned relative to the predetermined datum and is adapted to move the substrate from a first position, with the substrate captured by the moveable holder, to a second position with the substrate disengaged from the holder and the seal, the substrate transport movement of the substrate from the first position to the second position effecting disengagement from the holder and the seal substantially without contacting the substrate; and
    wherein the seal is coupled to the holder in the first position and the seal is engaged with the substrate in the first position, and wherein the seal is disengaged from the holder and held by the substrate transport in the second position, such that in the second position both the substrate and the seal are held by the substrate transport with the seal disengaged from the substrate.

2. The substrate loader of claim 1, wherein the substrate transport is coupled to the holder support frame by a first coupling and a second coupling, and wherein the first coupling is decoupleable from the substrate transport.

3. The substrate loader according to claim 2, wherein the first coupling includes at least one clamp which clamps and unclamps the substrate transport to the holder support frame.

4. The substrate loader of claim 1, wherein the substrate transport has two independent axes of motion with the substrate chuck moveable in a common direction substantially perpendicular to a surface of the substrate, with a face of the substrate chuck constrained to remain substantially parallel to the surface of the substrate during motion of the substrate chuck and during engagement of the substrate chuck with the substrate.

5. The substrate loader of claim 1, wherein the substrate transport has a tilt drive and a swing drive, with the swing drive adapted to rotate the substrate from a first substantially vertical position to a second substantially vertical position and with the tilt drive adapted to rotate the substrate from the second vertical position to a third substantially horizontal position.

6. The substrate loader of claim 1, wherein the substrate chuck comprises a non-contact Bernoulli chuck.

7. The substrate loader of claim 1, wherein the substrate chuck comprises a non-contact air bearing chuck.

8. The substrate loader of claim 1, wherein the substrate chuck comprises an interchangeable chuck, interchangeable between a non-contact Bernoulli chuck and a non-contact air bearing chuck.

9. The substrate loader of claim 1 further comprising a substrate pick up and flip device rigidly coupled to the base.

10. The substrate loader according to claim 1, wherein the substrate transport includes a seal holder for holding said seal, and wherein said substrate chuck and said seal holder are mounted to the substrate transport for relative movement between the substrate chuck and the seal holder such that in the second position the substrate is held by the substrate chuck and the seal is held by the seal holder with the seal disengaged from the substrate.

11. A substrate loader adapted to load and unload a substrate to and from a moveable holder, the substrate, when captured by the moveable holder, being contacted on a first side by the moveable holder and by a seal on a second side opposite the first side, the substrate loader comprising:
a base;
a holder support frame coupled to the base, the holder support frame adapted to repeatably position the moveable holder relative to a predetermined datum; and
a substrate transport coupled to the base and having a non-contact substrate chuck and adapted to move and transport the substrate relative to the holder;
wherein, the substrate transport is deterministically positioned relative to the predetermined datum and is adapted to move the substrate from a first position, with the substrate captured by the moveable holder, to a second position with the substrate disengaged from the holder and the seal, the substrate transport movement of the substrate from the first to the second position effecting disengagement from the holder and seal, wherein the non-contact substrate chuck is configured so that disengagement from the holder and seal is effected when moving from the first position to the second position with the substrate held without contact by the non-contact substrate chuck; and
wherein the seal is coupled to the holder in the first position and the seal is engaged with the substrate in the first position, and wherein the seal is disengaged from the holder and held by the substrate transport in the second position, such that in the second position both the substrate and the seal are held by the substrate transport with the seal disengaged from the substrate.

12. The substrate loader of claim 11, wherein the substrate transport has two independent axes of motion with the non-contact substrate chuck moveable in a common direction substantially perpendicular to a surface of the substrate, with a face of the non-contact substrate chuck constrained to remain substantially parallel to the surface of the substrate during motion of the non-contact substrate chuck and during engagement of the non-contact substrate chuck with the substrate.

13. The substrate loader of claim 11, wherein the substrate transport has a tilt drive and a swing drive, with the swing drive adapted to rotate the substrate from a first substantially vertical position to a second substantially vertical position and with the tilt drive adapted to rotate the substrate from the second vertical position to a third substantially horizontal position.

14. The substrate loader of claim 11, wherein the non-contact substrate chuck comprises a non-contact Bernoulli chuck.

15. The substrate loader of claim 11, wherein the non-contact substrate chuck comprises a non-contact air bearing chuck.

16. The substrate loader of claim 11, wherein the non-contact substrate chuck is interchangeable between an interchangeable non-contact Bernoulli chuck and an interchangeable non-contact air bearing chuck.

17. The substrate loader of claim 11 further comprising a substrate pick up and flip device coupled to the base.

18. The substrate loader according to claim 11, wherein the substrate transport includes a seal holder for holding said seal, and wherein said non-contact substrate chuck and said seal holder are mounted to the substrate transport for relative movement between the non-contact substrate chuck and the seal holder such that in the second position the substrate is held by the non-contact substrate chuck and the seal is held by the seal holder with the seal disengaged from the substrate.

19. A substrate loader adapted to load a substrate to and from a moveable holder, the substrate, when captured by the moveable holder, being contacted on a first side by the moveable holder and by a seal on a second side opposite the first side, the substrate loader comprising:
a base;
a holder support frame coupled to the base, the holder support frame adapted to repeatably position the moveable holder relative to a predetermined datum; and
a substrate transport coupled to the holder support frame and having a substrate transport frame and a non-contact substrate chuck moveable relative to the substrate transport frame;
wherein the substrate transport is adapted to transport the substrate from a first position with the substrate held by the moveable holder to a second position with the substrate held by the non-contact substrate chuck and disengaged from the holder and the seal; and wherein the substrate transport frame is coupled to and fixed with respect to the holder support frame when the substrate is transferred from the holder to the substrate transport, and
wherein the seal is coupled to the holder in the first position and the seal is engaged with the substrate in the first position, and wherein the seal is disengaged from the holder and held by the substrate transport in the second position, such that in the second position both the substrate and the seal are held by the substrate transport with the seal disengaged from the substrate.

20. The substrate loader according to claim 19, wherein the substrate transport includes a seal holder for holding said seal, and wherein said non-contact substrate chuck and said seal holder are mounted to the substrate transport for relative movement between the non-contact substrate chuck and the seal holder such that in the second position the substrate is held by the non-contact substrate chuck and the seal is held by the seal holder with the seal disengaged from the substrate.

21. A substrate loader according to claim 20, further including at least one inflatable bladder to provide relative movement between the seal holder and the non-contact substrate chuck.

22. A substrate loader according to claim 19, further including at least one clamp for clamping and unclamping the substrate transport relative to the holder support frame, and wherein the transport holder is also pivotably coupled to the holder support frame such that when the at least one clamp is in an unclamped position the substrate transport is pivotable relative to the holder support frame, and wherein when the clamp is in a clamped position the substrate transport is fixed relative to the holder support frame.

* * * * *